United States Patent
Moore et al.

(10) Patent No.: US 10,571,287 B2
(45) Date of Patent: Feb. 25, 2020

(54) SYSTEM AND METHOD FOR VEHICLE ENERGY MANAGEMENT

(71) Applicant: The Boeing Company, Chicago, IL (US)

(72) Inventors: Michael E. Moore, O'Fallon, MO (US); Kevin A. Grider, St. Charles, MO (US)

(73) Assignee: The Boeing Company, Chicago, IL (US)

( * ) Notice: Subject to any disclaimer, the term of this patent is extended or adjusted under 35 U.S.C. 154(b) by 135 days.

(21) Appl. No.: 15/686,205

(22) Filed: Aug. 25, 2017

(65) Prior Publication Data

US 2019/0063937 A1    Feb. 28, 2019

(51) Int. Cl.
*G01C 21/34*   (2006.01)
*G01C 21/36*   (2006.01)
*G01R 21/133*  (2006.01)

(52) U.S. Cl.
CPC ..... *G01C 21/3469* (2013.01); *G01C 21/3697* (2013.01); *G01R 21/133* (2013.01)

(58) Field of Classification Search
CPC . B60L 50/50; G01C 21/3469; G01C 21/3697; G01R 21/133
See application file for complete search history.

(56) References Cited

U.S. PATENT DOCUMENTS

| 9,476,719 B2      | 10/2016 | Meyer et al. | |
|---|---|---|---|
| 2009/0299558 A1*  | 12/2009 | Hidaka      | B60K 6/48 701/22 |
| 2010/0094496 A1*  | 4/2010  | Hershkovitz | B60L 3/12 701/22 |
| 2011/0060517 A1*  | 3/2011  | Kono        | G01C 21/3469 701/123 |
| 2012/0109515 A1*  | 5/2012  | Uyeki       | G01C 21/3469 701/423 |
| 2013/0030605 A1*  | 1/2013  | Basir       | G01C 21/3461 701/1 |
| 2013/0151046 A1*  | 6/2013  | Choi        | G08G 1/096827 701/22 |
| 2013/0179057 A1*  | 7/2013  | Fisher      | B60L 53/68 701/117 |
| 2013/0261966 A1*  | 10/2013 | Wang        | G01C 21/3469 701/533 |
| 2014/0172285 A1*  | 6/2014  | Kuhn        | B60L 11/1861 701/123 |

(Continued)

*Primary Examiner* — Babar Sarwar
(74) *Attorney, Agent, or Firm* — Coats & Bennett, PLLC

(57) ABSTRACT

Aspects of the present disclosure provide a system for managing the energy resources of a vehicle, such as an electric car. A destination location for the vehicle, as well as a desired amount of energy that should remain in the vehicle upon arrival at the destination location, is determined. Based on this information, the system generates a set of candidate paths along which the vehicle can navigate to the destination location such that, upon arrival, the vehicle has the desired amount of energy in reserve. One of those paths is selected, and while travelling to the destination location, a database with information regarding its energy consumption along the selected path. So updated, the system can generate more accurate candidate paths with respect to an estimated energy consumption for the vehicle.

20 Claims, 14 Drawing Sheets

(56) References Cited

U.S. PATENT DOCUMENTS

| | | | |
|---|---|---|---|
| 2015/0345966 A1* | 12/2015 | Meuleau | G01C 21/3453 |
| | | | 701/23 |
| 2015/0345967 A1* | 12/2015 | Meuleau | G01C 21/3453 |
| | | | 701/25 |
| 2015/0345971 A1* | 12/2015 | Meuleau | G01C 21/3492 |
| | | | 701/25 |
| 2016/0245662 A1* | 8/2016 | Rajagopalan | G01C 21/3469 |
| 2017/0075360 A1* | 3/2017 | Von Novak | G05D 1/042 |
| 2018/0001788 A1* | 1/2018 | Geu | B60L 15/2009 |
| 2018/0081360 A1* | 3/2018 | Bostick | G05D 1/0088 |
| 2018/0283896 A1* | 10/2018 | Piemonte | G01C 21/3664 |
| 2019/0063937 A1* | 2/2019 | Moore | G01C 21/3697 |

* cited by examiner

SYSTEM AND METHOD FOR VEHICLE ENERGY MANAGEMENT

TECHNICAL FIELD

The present disclosure relates generally to the field of energy resource management, and more particularly to systems and methods for managing the energy source of a vehicle.

BACKGROUND

Most, if not all, vehicles have a reservoir or tank that contains a supply of an energy source. Aircraft and automobiles, for example, have fuel tanks that contain jet fuel or gasoline, respectively. Vehicles that rely on electricity for power have a system of rechargeable batteries. Regardless of the type of vehicle and energy source, however, the range of the vehicles is limited by several factors. Among these are the amount of energy they are able to carry, the amount of traffic they encounter, the surface of the terrain over which they travel, various weather conditions, and the like. Such factors often lead to "range anxiety" for the vehicle operators, which is the concern over whether a vehicle has a sufficient amount of energy to reach its destination.

BRIEF SUMMARY

Aspects of the present disclosure relate to methods, apparatuses, and computer program products for accurately managing the energy source of a vehicle so that the vehicle will reach a desired destination location with a predetermined amount of the energy source in reserve.

In more detail, one aspect of the present disclosure provides a method for managing an energy source of a vehicle. In this aspect, the method comprises generating one or more candidate paths between an origination location and a destination location based on one or more path segments stored in an energy consumption database. Each path segment has an associated path segment metric that identifies an average amount of energy needed by a vehicle to traverse the path segment in a predetermined direction. Then, for each of the one or more candidate paths, the method generates a total path metric based on the path segment metrics associated with each path segment of the candidate path. The total path metric identifies the average amount of energy needed by the vehicle to traverse the candidate path in the predetermined direction. A path from the one or more candidate paths is then selected based on the total path metrics. The path is selected such that the amount of energy remaining in the vehicle upon arriving at the destination location is greater than or equal to a predetermined amount of energy. While the vehicle traverses the selected path, the actual amount of energy used by the vehicle to traverse a given path segment in the predetermined direction is measured. The path segment metric associated with the given path segment in the energy consumption database is then updated based on the actual amount of energy used by the vehicle to traverse the given path segment in the predetermined direction.

In one aspect, while the vehicle traverses the selected path, a currently remaining amount of energy for the vehicle is periodically determined. An indicator of the currently remaining amount of energy is also output to a display device for a vehicle operator. Based on the currently remaining amount of energy, whether the amount of energy remaining in the vehicle upon arriving at the destination location will be greater than or equal to the predetermined amount of energy is determined. An alarm is generated for the vehicle operator responsive to determining that the amount of energy remaining in the vehicle upon arriving at the destination location will be less than the predetermined amount of energy.

In one aspect, determining whether the amount of energy remaining in the vehicle upon arriving at the destination location will be greater than or equal to the predetermined amount of energy comprises generating an intermediate energy metric at an intermediate location along the selected path. The intermediate energy metric is generated based on a total amount of energy already consumed by the vehicle and an estimate of the amount of energy that the vehicle will need to arrive at the destination location from the intermediate location. The intermediate energy metric is then compared to the predetermined amount of energy, and based on a result of the comparison, a determination is made as to whether the amount of energy remaining in the vehicle upon arriving at the destination location will be greater than or equal to the predetermined amount of energy.

In one aspect, the intermediate energy metric is also generated based on a total amount of energy produced by the vehicle while traveling to the intermediate location, as well as an estimate of the amount of energy that the vehicle will produce while traveling to the destination location from the intermediate location.

According to aspects of the present disclosure, the path segment metric for each path segment in the energy consumption database further identifies an ingress boundary for the path segment, an exit boundary for the path segment, and a direction of travel for the path segment. In these aspects, measuring the actual amount of energy used by the vehicle to traverse a given path segment in the predetermined direction comprises measuring the amount of energy remaining in the vehicle responsive to determining that the vehicle has crossed the ingress boundary associated with the given path segment, measuring the amount of energy remaining in the vehicle responsive to determining that the vehicle has crossed the exit boundary of the given path segment, and computing the actual amount of energy used by the vehicle to traverse the given path segment based on the measured amounts of energy.

Additionally, in aspects where the path segment metric for each path segment in the energy consumption database further identifies a distance between the ingress boundary and the exit boundary, a duration of travel through the given path segment, and an average velocity of the vehicle traveling through the given path segment, the direction of travel through the given path segment based on the ingress boundary and the exit boundary is determined, as is the duration of travel and the average velocity of the vehicle. In one aspect, the average velocity is based on the duration of travel and the distance between the ingress boundary and the exit boundary. So determined, one aspect updates the path segment metric associated with the given path segment in the energy consumption database based on the determined direction of travel, the determined duration of travel, and the determined average velocity of the vehicle.

In one aspect, the method further comprises navigating the vehicle to the destination location via the selected path.

In one aspect, updating the path segment metric associated with the given path segment in the energy consumption database comprises determining whether the actual amount of energy used by the vehicle to traverse a given path segment in the predetermined direction deviates from the path segment metric by a predetermined amount, averaging the path segment metric associated with the given path segment and the actual amount of energy used by the vehicle responsive to determining that the actual amount of energy used by the vehicle does not deviate from the path segment metric for the path segment by a predetermined threshold, and replacing the path segment metric associated with the path segment with the actual amount of energy used by the vehicle responsive to determining that the actual amount of energy needed by the vehicle does deviate from the path segment metric by a predetermined threshold.

In one aspect, the present disclosure provides a computing device configured to manage an energy source for a vehicle. In this aspect, the computing device comprises a communications interface configured to communicate data with one or more devices and processing circuitry. The processing circuitry is configured to generate one or more candidate paths between an origination location and a destination location based on one or more path segments stored in an energy consumption database. Each path segment has an associated path segment metric that identifies an average amount of energy needed by a vehicle to traverse the path segment in a predetermined direction. For each of the one or more candidate paths, the processing circuitry is configured to generate a total path metric based on the path segment metrics associated with each path segment of the candidate path. The total path metric identifies the average amount of energy needed by the vehicle to traverse the candidate path in the predetermined direction. Additionally, the processing circuit is configured to select a path from the one or more candidate paths based on the total path metrics. The path is selected such that the amount of energy remaining in the vehicle upon arriving at the destination location is greater than or equal to a predetermined amount of energy. While the vehicle traverses the selected path, the processing circuit is configured to measure the actual amount of energy used by the vehicle to traverse a given path segment in the predetermined direction, and update the path segment metric associated with the given path segment in the energy consumption database based on the actual amount of energy used by the vehicle to traverse the given path segment in the predetermined direction.

In one aspect, while the vehicle traverses the selected path, the processing circuit receives periodic signals from an energy sensor reporting a currently remaining amount of energy for the vehicle, outputs an indicator of the currently remaining amount of energy to a display device associated with the vehicle, based on the currently remaining amount of energy, determines whether the amount of energy remaining in the vehicle upon arriving at the destination location will be greater than or equal to the predetermined amount of energy, and generates an alarm responsive to determining that the amount of energy remaining in the vehicle upon arriving at the destination location will be less than the predetermined amount of energy.

In one aspect, the processing circuitry determines whether the amount of energy remaining in the vehicle upon arriving at the destination location will be greater than or equal to the predetermined amount of energy by generating, at an intermediate location along the selected path, an intermediate energy metric based on a total amount of energy already consumed by the vehicle and an estimate of the amount of energy that the vehicle will need to arrive at the destination location from the intermediate location. The processing circuitry then compares the intermediate energy metric to the predetermined amount of energy, and determines whether the amount of energy remaining in the vehicle upon arriving at the destination location will be greater than or equal to the predetermined amount of energy based on a result of the comparison.

In one aspect, the processing circuitry generates the intermediate energy metric by generating the intermediate energy metric based on a total amount of energy produced by the vehicle while traveling to the intermediate location, and an estimate of the amount of energy that the vehicle will produce while traveling to the destination location from the intermediate location.

In one or more aspects of the disclosure, the path segment metric for each path segment in the energy consumption database identifies an ingress boundary for the path segment, an egress boundary for the path segment, and a direction of travel for the path segment.

In one aspect, the processing circuitry measures the actual amount of energy used by the vehicle to traverse a given path segment in the predetermined direction by measuring the amount of energy remaining in the vehicle responsive to determining that the vehicle has crossed the ingress boundary associated with the given path segment, measuring the amount of energy remaining in the vehicle responsive to determining that the vehicle has crossed the egress boundary of the given path segment, and then calculating the actual amount of energy used by the vehicle to traverse the given path segment based on the measured amounts of energy.

In one aspect, the path segment metric for each path segment in the energy consumption database identifies a distance between the ingress boundary and the egress boundary, a duration of travel through the given path segment, and an average velocity of the vehicle traveling through the given path segment. In such aspects, the processing circuitry determines the direction of travel through the given path segment based on the ingress boundary and the egress boundary, the duration of travel through the given path segment, and the average velocity of the vehicle through the given path segment based on the duration of travel and the distance between the ingress boundary and the egress boundary. So determined, the processing circuitry then updates the path segment metric associated with the given path segment in the energy consumption database based on the determined direction of travel, the determined duration of travel, and the determined average velocity of the vehicle.

In one aspect, the processing circuitry updates the path segment metric associated with the given path segment in the energy consumption database by determining whether the actual amount of energy used by the vehicle to traverse a given path segment in the predetermined direction deviates from the path segment metric by a predetermined amount, averaging the path segment metric associated with the given path segment and the actual amount of energy used by the vehicle responsive to determining that the actual amount of energy used by the vehicle does not deviate from the path segment metric for the path segment by a predetermined threshold, and replacing the path segment metric associated with the path segment with the actual amount of energy used by the vehicle responsive to determining that the actual amount of energy needed by the vehicle does deviate from the path segment metric by a predetermined threshold.

In one aspect, the processing circuitry is further configured to determine a validity of a value representing the actual amount of energy used by the vehicle based on a comparison with a time-qualified count threshold, and replace the path segment metric with the value representing the actual amount of energy used by the vehicle based on the comparison.

In one aspect, the processing circuitry is further configured to calculate a wind drag coefficient based on sensor data received from a wind sensor associated with the vehicle, determine a velocity and direction of travel for the vehicle, and generate the total path metric based additionally on the wind drag coefficient, the velocity of the vehicle, and the direction of travel for the vehicle.

In one aspect, the present disclosure also provides a non-transitory computer readable medium storing a computer program product. The computer program product controls a programmable computing device of a vehicle, and comprises software instructions that, when executed on processing circuitry of the programmable computing device, cause the processing circuitry to generate one or more candidate paths between an origination location and a destination location based on one or more path segments stored in an energy consumption database, wherein each path segment has an associated path segment metric that identifies an average amount of energy needed by a vehicle to traverse the path segment in a predetermined direction. For each of the one or more candidate paths, the software instructions cause the processing circuitry to generate a total path metric based on the path segment metrics associated with each path segment of the candidate path, wherein the total path metric identifies the average amount of energy needed by the vehicle to traverse the candidate path in the predetermined direction. Additionally, the software instructions cause the processing circuitry to select a path from the one or more candidate paths based on the total path metrics, wherein the path is selected such that the amount of energy remaining in the vehicle upon arriving at the destination location is greater than or equal to a predetermined amount of energy, and while the vehicle traverses the selected path, measure the actual amount of energy used by the vehicle to traverse a given path segment in the predetermined direction. The software instructions also cause the processing circuitry to update the path segment metric associated with the given path segment in the energy consumption database based on the actual amount of energy used by the vehicle to traverse the given path segment in the predetermined direction.

BRIEF DESCRIPTION OF THE DRAWINGS

Aspects of the present disclosure are illustrated by way of example and are not limited by the accompanying figures with like references indicating like elements.

DETAILED DESCRIPTION

Figure 1:
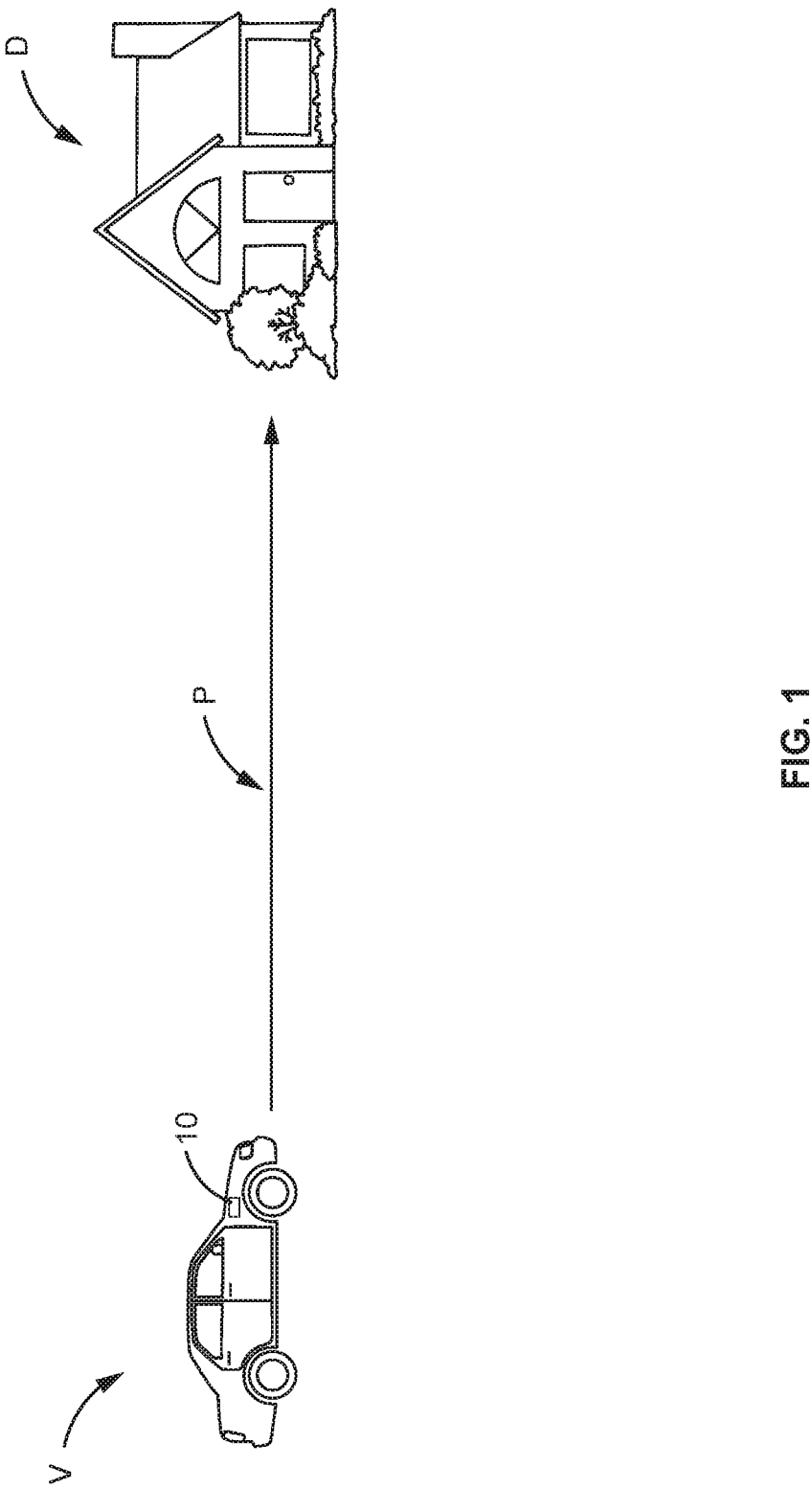
FIG. 1 illustrates a vehicle configured according to one aspect of the present disclosure travelling along a selected path to a destination.

Aspects of the present disclosure relate to a method, apparatus, and computer program product for accurately managing the energy source of a vehicle so that the vehicle will reach a desired destination location with a predetermined amount of the energy source in reserve. According to the present disclosure, the aspects may be implemented by the vehicle, a computer server disposed in a communications network and communicatively connected to the vehicle via an established communications link, or by both the vehicle and the computer server.

In more detail, aspects of the present disclosure collect, process, and maintain data associated with the energy consumption a vehicle traveling along a path to a desired destination location, and then utilize that data to actively manage the energy resources of the vehicle and/or similar vehicles. Such data includes, but is not limited to, the type of vehicle, the age of the vehicle, and the amount of energy the vehicle consumes relative to one or more characteristics that affect that consumption. The characteristics can be "fixed," such as the type of road surface and/or terrain over which the vehicle is traveling, or "variable," such as the load placed on the vehicle, the amount of traffic the vehicle will encounter, the weather, the temperature, the wind speed and direction, wind drag the existence and type of precipitation, the performance of the vehicle, the degradation and/or contamination of the vehicle components, and the rate of energy consumption. In some instances, characteristics such as the amount of traffic and congestion may be further dynamically affected by the day of the week and/or time of day the vehicle travels to the destination.

The collection, processing, and subsequent utilization of the energy consumption data in managing an energy source of a vehicle differentiates the present disclosure from conventional systems. In particular, conventional systems simply inform vehicle operators only of the remaining amount of energy and range of travel, usually in the form of a gauge or display. Thereafter, the operators must decide whether the vehicle will have a sufficient amount of energy to reach the desired destination based on that information. Conventional systems do not consider how the various fixed and variable characteristics of the path along which the vehicle is traveling can affect that range. Nor do they appraise the operator of that information or select a path along which the vehicle can travel based on the information. Additionally, conventional systems are not configured to ensure that a vehicle arrives at a desired destination having a predetermined amount of energy in reserve. Thus, conventional methods are in many respects not as accurate as they should be.

The present disclosure, however, provides advantages over such conventional systems as well as functionality not currently available with such systems. Particularly, by managing the energy source of a vehicle in accordance with aspects of the present disclosure, an operator can be confident in knowing that the vehicle will arrive at the destination location with a sufficient amount of energy in reserve. This allows vehicles having limited range, energy storage capacity, and/or infrequent access to recharging or refueling stations to travel to a destination location with enough energy left over to refuel, recharge, or return to the point of departure. Moreover, the amount and type of information and data that is collected, processed, and maintained allows computing devices to estimate the vehicle's energy consumption over one or more paths more accurately, thereby allowing the vehicle to arrive at the destination location with the desired amount of reserve energy.

Turning now to the drawings, FIG. 1 illustrates a vehicle V travelling to a destination D via a selected path P. In accordance with aspects of the present disclosure, vehicle V comprises an energy consumption computing device 10 configured to select path P and to manage the energy source of vehicle V while it traverses the path P. In particular, computing device 10 generates one or more candidate paths using data and information maintained in an energy consumption database, and then selects path P from those candidate paths. In one aspect, a user or operator of vehicle V manually selects the desired path P. In other aspects, vehicle V is configured to autonomously make the selection of path P based on various criteria.

In accordance with the present disclosure, path P is selected such that vehicle V will arrive at destination D with a predetermined amount of energy in reserve. Additionally, to help ensure that vehicle V arrives with the desired amount of reserve energy, computing device 10 monitors the actual amount of energy consumed by the vehicle V while it traverses path P, and periodically estimates the energy consumption of vehicle V relative to the various fixed and variable characteristics of path P. Based on the periodic estimates, computing device 10 is configured to adjust the path P as necessary during travel.

Additionally, computing device 10 also updates the data and information in the energy consumption database with the actual energy usage data and information it monitors while vehicle V traverses path P. Knowing the actual amounts of energy consumed by vehicles that are the same or similar to vehicle V allows computing device 10 to more accurately model the various paths P to destination location D.

It should be noted that the specification and figures describe the aspects of the present disclosure in the context of an electric car, such as the CHEVROLET VOLT, the BMW i3, or the TESLA MODEL S. However, those of ordinary skill in the art will readily appreciate that this is merely for illustrative purposes, and that computing device 10 is not limited solely to implementation by electric vehicles. As seen later in more detail, computing device 10 is also capable of being implemented by non-electric vehicles and by hybrid vehicles, as well as by a network-based application server in communication with vehicle V. Thus, regardless of the type of vehicle, they, too, can benefit from the advantages that the aspects of the present disclosure provide.

Figure 2:
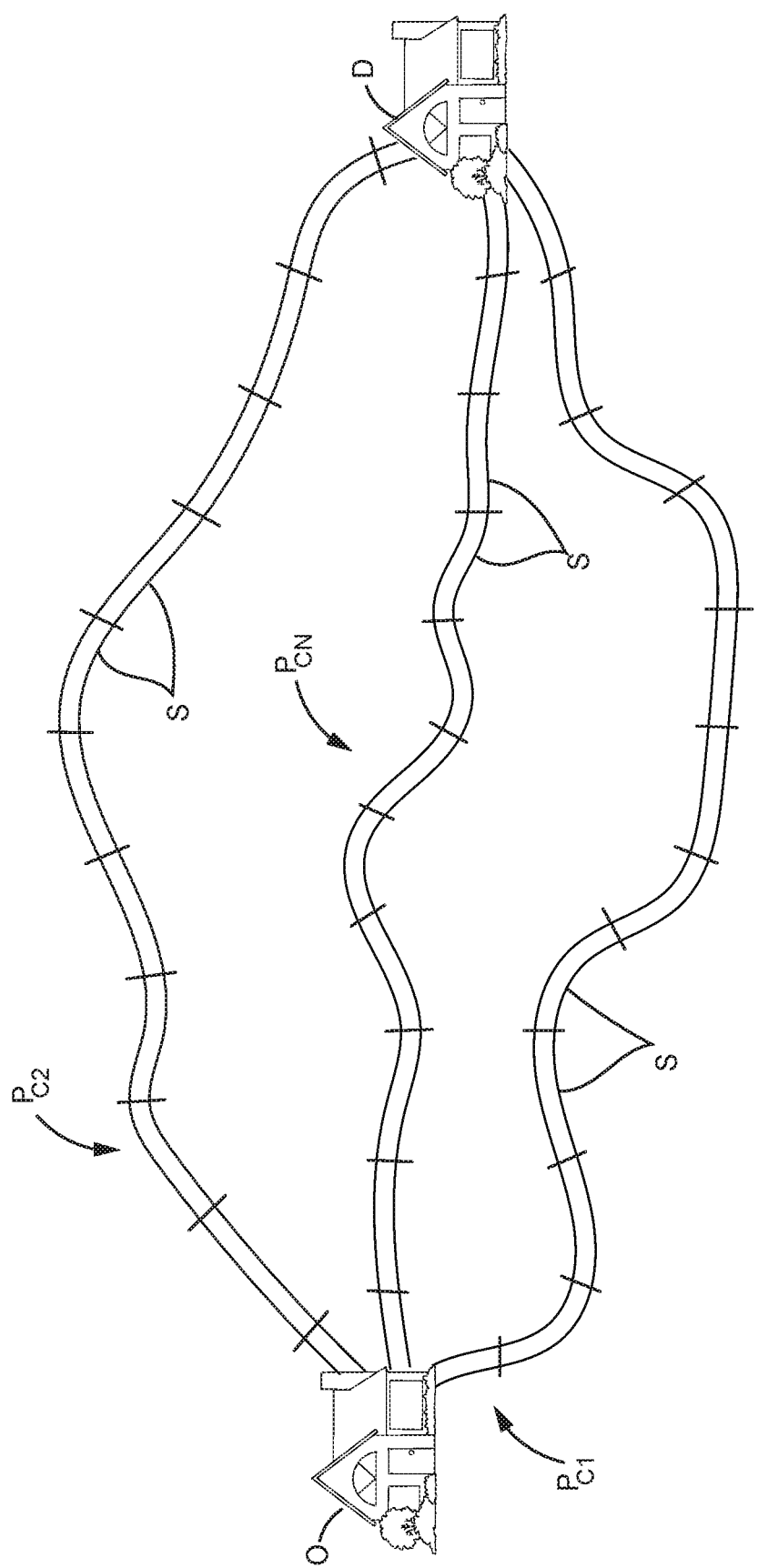
FIG. 2 illustrates a plurality of candidate paths segmented according to one aspect of the present disclosure.

Generally, there are multiple paths that vehicle V can navigate to arrive at any given destination location. Thus, in one aspect, computing device 10 is configured to identify those "candidate paths" for possible display to the operator of the vehicle V. FIG. 2 illustrates such a plurality of candidate paths $P_{C1}$, $P_{C2}$ ... $P_{CN}$ generated by computing device 10 according to one aspect of the present disclosure.

Particularly, each candidate path $P_{C1}$, $P_{C2}$ ... $P_{CN}$ comprises a plurality of path segments S of equal length. As seen later in more detail, each path segment S is maintained in the energy consumption database as a set of data and information that includes a variety of metrics. One such metric identifies an average amount of energy needed by a vehicle to traverse the path segment in a predetermined direction.

To generate the candidate paths $P_{C1}$, $P_{C2}$ ... $P_{CN}$, computing device 10 determines both a point of origin O, which may be a current location for vehicle V, and the destination location D. The candidate paths $P_{C1}$, $P_{C2}$ ... $P_{CN}$ between these two points are then determined based on the metrics associated with each path segment S of each candidate path $P_{C1}$, $P_{C1}$ ... $P_{CN}$. Particularly, for each path segment S in a given candidate path $P_{C1}$, $P_{C1}$ ... $P_{CN}$, computing device 10 obtains a metric that identifies the average amount of energy needed by a vehicle to traverse that path segment S in a predetermined direction. Computing device 10 then sums the path segment metrics of each of the path segments S to generate an estimated total path metric. In some aspects, computing device also considers the effects of one or more of the fixed and/or variable characteristics when calculating the total path metric. This total path metric identifies the average amount of energy needed by the vehicle to traverse the given candidate path $P_{C1}$, $P_{C2}$ ... $P_{CN}$ in the predetermined direction.

Figure 3B:
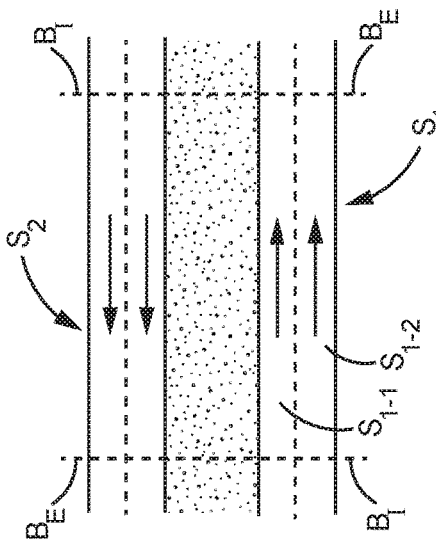
FIGS. 3A-3C illustrate different types of path segments according to various aspects of the present disclosure.
Figure 3A:
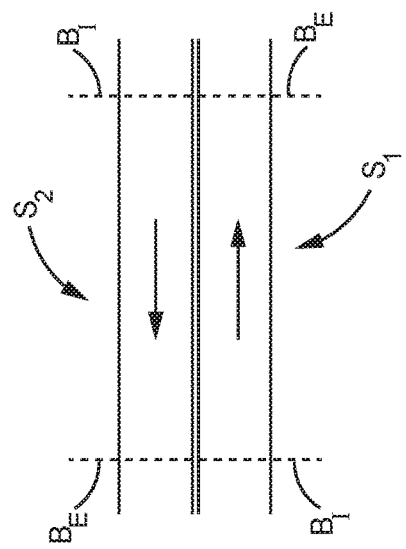
Figure 3C:
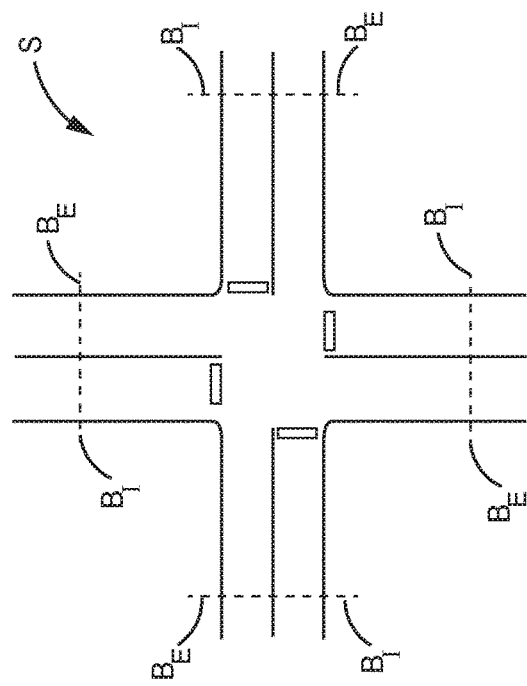

FIGS. 3A-3C illustrate some of the various types of path segments S modeled by aspects of the present disclosure. As seen in these figures, each path segment S has an equal length. Such length may be measured and described in miles, nautical miles, kilometers, meters, or in any measurement of length needed or desired. Additionally, each path segment S has two boundaries—an ingress boundary $B_I$, which indicates a point of ingress into a path segment S, and an egress boundary $B_E$, which indicates a point of egress from a path segment S.

Generally, a given path segment S covers a portion of a given candidate path $P_{C1}$, $P_{C2}$ ... $P_{CN}$ in one direction. Thus, FIG. 3A illustrates two path segments $S_1$, $S_2$ covering corresponding portions of a two-lane road in respective directions. FIG. 3B illustrates two path segments $S_1$, $S_2$ covering corresponding portions of a four-lane highway in respective directions. In this aspect, each path segment $S_1$, $S_2$ covers all lanes going in the same direction. In other aspects, however, one or both of the path segments $S_1$, $S_2$ may cover only a single lane. Thus, in the context of FIG. 3B, path segment $S_1$ may itself comprise two path segments $S_{1-1}$ and $S_{1-2}$—each covering a single lane and having its own associated set of path segment metrics identifying, inter alia, the average amount of energy needed by a vehicle to traverse that particular lane in that direction.

FIG. 3C graphically illustrates how one aspect of the present disclosure models an intersection in terms of path segments S. Particularly, the intersection in this aspect is modeled as a single path segment S having multiple ingress and egress boundaries $B_I$, $B_E$. Thus, in this aspect, the metrics associated with path segment S (i.e. the intersection) are the same regardless of the direction of travel.

Regardless of the type of path segment S, however, each path segment S is modeled in the energy consumption database using its own associated data and information. As stated above, the data and information includes a metric value identifying the average amount of energy needed by a vehicle to traverse the path segment S in its associated direction, but may also include other data and information as needed or desired.

The following table illustrates some of the data and information associated with each path segment S maintained in the energy consumption database and used to model a path segment S.

TABLE 1

| | |
|---|---|
| PATH SEGMENT ID | 01001 |
| PREVIOUS PATH SEGMENT ID | 01000 |
| NEXT PATH SEGMENT ID | 01002 |
| DIRECTION | East |
| SEGMENT LENGTH | 0.25 mile |
| SURFACE TYPE | Asphalt |
| GRADE | −3% |
| TAKEOFF SLOPE | 10° |
| LANDING SLOPE | 5° |
| ALTITUDE | |
| VEHICLE TYPE | Tesla Model S |
| VEHICLE YEAR | 2017 |
| AVERAGE VELOCITY | 72 mph |
| AVERAGE TRAVERSAL DURATION | 00:00:32 |
| AVERAGE ENERGY CONSUMED | 0.15 kWh |

The PATH SEGMENT ID comprises a value that uniquely identifies a path segment, and that links the path segment to a previous path segment and a next path segment. Similarly, the PREVIOUS PATH SEGMENT ID and NEXT PATH SEGMENT ID fields comprise values that identify adjacent path segments. In this aspect, there are only two adjacent path segments S—01000 and 01001. However, it should be readily appreciated that any given path segment S may connect to more than two adjacent segments, or less than two adjacent path segments.

The ingress and egress boundaries $B_I$, $B_E$ determine the value of the DIRECTION field; however, in one aspect, this value is also determined based on a compass or other such sensor associated with vehicle V. The SEGMENT LENGTH field indicates the distance between the two boundaries $B_I$, $B_E$ for path segment S, while the SURFACE TYPE identifies a type of surface for the path segment. In this aspect, the surface of the path segment S is indicated as being an asphalt type surface; however, as those of ordinary skill in the art will appreciate, other types of surfaces are possible.

The GRADE value identifies the particular grade of the path segment S. In one aspect, a negative value (e.g., −3%) indicates that the path segment S has a "downhill" grade and that a vehicle V traversing that path segment S would be going downhill. A positive value (e.g., 10%) would indicate that the path segment S has an "uphill" grade and that a vehicle V traversing the path segment S would be going "uphill." Such information is beneficial as it affects both energy consumption and energy production. Particularly, electric vehicles V traversing a path segment S having a positive grade would likely consume more energy and generate less energy. On the other hand, electric vehicles V traversing a path segment S having a negative grade would likely consume less energy and generate more energy.

The TAKEOFF SLOPE and LANDING SLOPE values indicate the slope for the takeoff and landing of aircraft, respectively. Such information is also beneficial as the energy usage profiles for aircraft that are taking off are drastically different than those for aircraft that are landing. Specifically, aircraft utilize much more energy during takeoff and trying to reach altitude than when they are landing. Similarly, for aircraft, rotorcraft, submersible vehicles, and the like, the values for ALTITUDE indicate an average altitude of the path segment S. Positive altitude values would indicate above sea-level values while negative altitude values would indicate below sea-level values.

The VEHICLE TYPE and VEHICLE YEAR fields identify the type and year of the vehicle V for which the information associated with the path segment is appropriate. This is because the characteristics of the path segment will affect the energy consumption of different types of vehicles V differently. Additionally, the age of the vehicle V will also have an impact on energy consumption as older vehicles may not be as efficient as newer models. Thus, it is possible in aspects of the present disclosure for a given path segment to have multiple records in the energy consumption database—each associated with the same path segment, but for one or more different vehicle types and/or vehicle ages.

The other fields seen in Table 1 comprise values defining an AVERAGE VELOCITY of the vehicle traversing the path segment S and an AVERAGE TRAVERSAL DURATION for the vehicle (i.e., the average time a vehicle requires to traverse the path segment S). The value for the AVERAGE VELOCITY field is computed, in one aspect, based on the times that vehicle V crosses the ingress and egress boundaries $B_I$, $B_E$. In such aspects, vehicle V comprises a clock configured to determine the time of entry and exit of path segment S. The value for the AVERAGE TRAVERSAL DURATION field can therefore computed based on the value for the AVERAGE VELOCITY field and distance identified in the SEGMENT LENGTH field.

The AVERAGE ENERGY CONSUMPTION field comprises a value indicating the amount of energy that vehicle V is estimated to require to traverse path segment S in the identified direction. Additionally, the values in the AVERAGE ENERGY CONSUMPTION field are utilized by aspects of the present disclosure in generating a total path metric that identifies the average amount of energy needed by the vehicle V to traverse all of the path segments S comprising the candidate path in the identified direction.

It should be noted that some aspects of the present disclosure model path segments S in terms of direction. This is because the energy consumed by a vehicle V traveling in one direction may be different from the energy consumed by the same or a similar vehicle V traveling on the same road, but in the opposite direction. The same is true for the production of energy in vehicles that are configured to produce energy. Such variances are the result of, inter alia, one or more of the fixed and/or variable characteristics associated with the path segments S.

Figure 4:
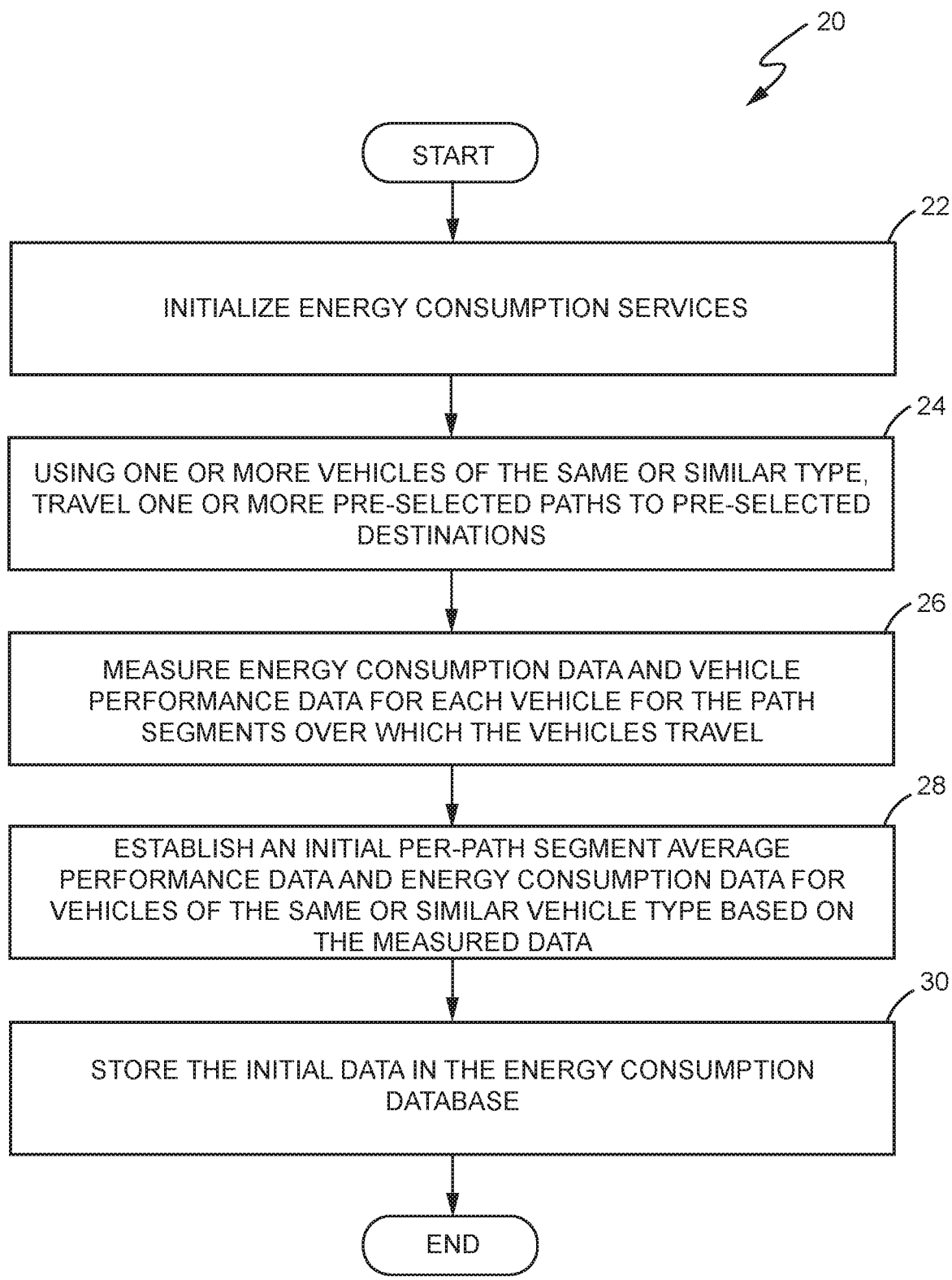
FIG. 4A is a flow diagram illustrating a method for initializing an energy consumption service according to one aspect of the present disclosure.
FIG. 4B is a flow diagram illustrating a method of managing an energy source of a vehicle according to one aspect of the present disclosure.

FIG. 4A is a flow diagram illustrating a method 20 for initializing an energy consumption service according to one aspect of the present disclosure. In this aspect, the energy consumption service comprises the computing device 10 and an energy consumption database located either on vehicle V, or on one or more computer servers in a network.

Generally, the steps of method 20 are performed prior to using the services provided by computing device 10. Thus, as seen in FIG. 4A, method 20 first initializes the energy consumption services for vehicle V (box 22). Such initialization includes, but is not limited to, launching a control application on vehicle V, determining various aspects of the vehicle V, such as the vehicle type and age, and establishing a communications link between computing device 10 and the energy consumption database. In aspects where the energy consumption database is resident in the computer network, initializing the services includes establishing a wireless communications link with the server associated with the database via a Radio Access Network (RAN), Wireless Access Network (WAN), or other access method as is known in the art.

Once services have been initialized, the energy consumption database can be loaded with an initial set of data. Particularly, vehicle V traverses one or more pre-selected paths to pre-selected destinations D (box 24). As the vehicle traverses each path segment S that comprises the pre-selected path, the vehicle's energy consumption and performance data is measured (box 26) and utilized to determine an initial per-path segment S average energy consumption and performance data (box 28). As stated above, these values are computed based, in part, on the "fixed" and "variable" characteristics associated with each path segment S. Once the initial data has been measured and determined, vehicle V stores the initial data in the energy consumption database (box 30). In one aspect, storing the initial data comprises storing the information seen in FIG. 1 in the energy consumption database on vehicle V. In other aspects, however, storing the initial data comprises sending the information in one or more messages to a network-based energy consumption database for storage.

Initializing the energy consumption services in this manner helps ensure that computing device 10 has at least an initial amount of data resident in the energy consumption database. Further, as the measured data is based on actual usage data for that vehicle V, computing device 10 is able to generate the most appropriate candidate paths, and select a desired one of those candidate paths based on highly accurate information. As stated previously, the selection of a desired path P may be performed autonomously by the system of the present disclosure, or in response to user input.

Figure 4B:
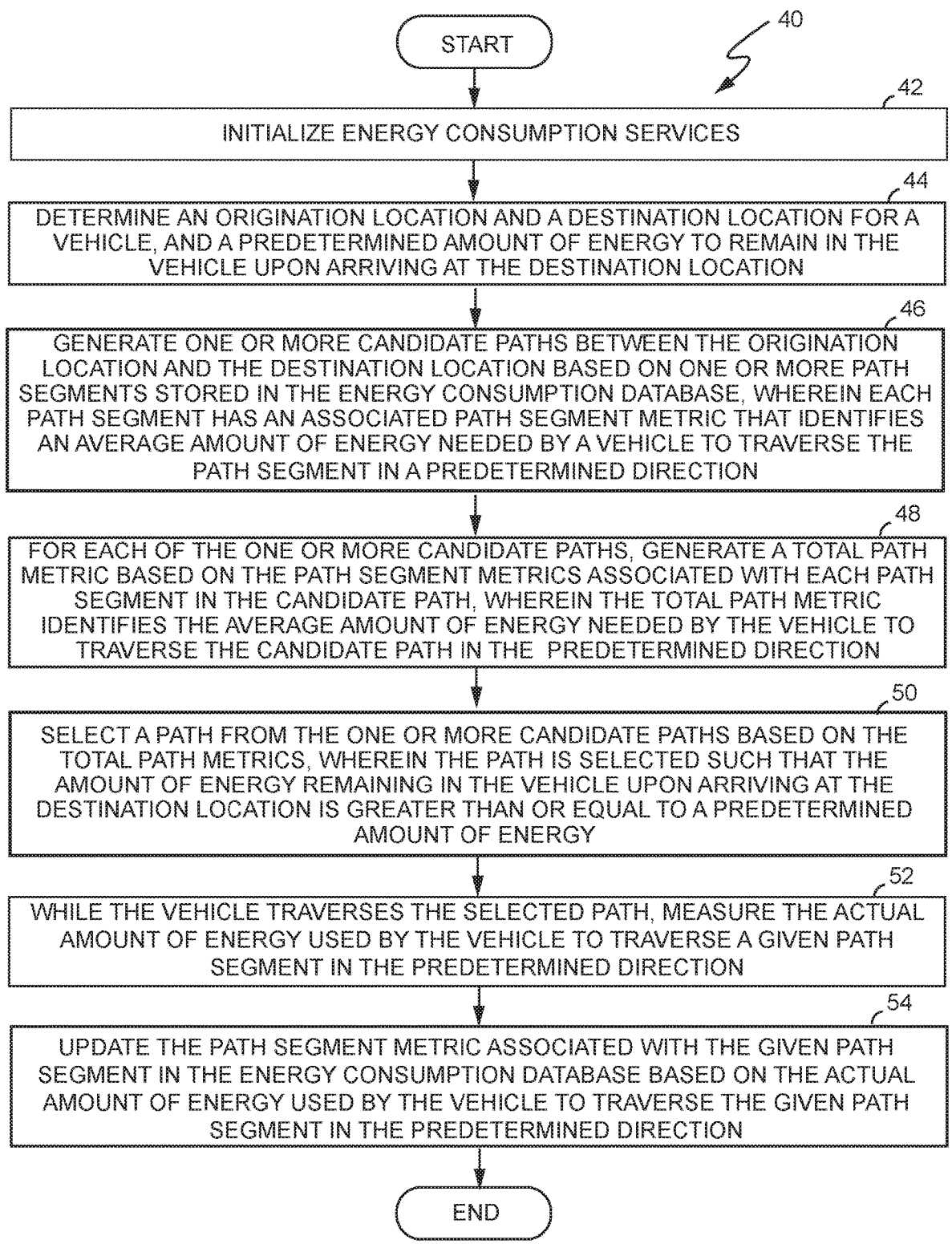

FIG. 4B is a flow diagram illustrating a method 40 of managing an energy source of a vehicle according to one aspect of the present disclosure. Method 40 begins with the initialization of the energy consumption services as previously described (box 42). Method 40 then determines an origination location O and a destination location D for vehicle V, as well as an amount of energy that the vehicle V should have in reserve upon arrival at the destination location D (box 44).

Some or all of this information may be determined by prompting the operator to manually provide the information, or in some instances, by obtaining the information from the vehicle V. In one aspect, vehicle V is equipped with a Global Positioning System (GPS). Using the GPS, vehicle V is able to determine the origination location O as being the current geographical location of vehicle V, and further, definitively identify the geographical location of the destination location D. As for the desired amount of reserve energy, one aspect of the present disclosure causes a prompt to be displayed requesting that the operator provide that information via a user interface or similar device.

Armed with the information, method 40 then generates the one or more candidate paths $P_{C1} \ldots P_{CN}$ between the origination location O and the destination location D based on one or more path segments S stored in the energy consumption database (box 46). As previously described, each path segment S in the energy consumption database has an associated path segment metric that identifies the average amount of energy needed by vehicle V to traverse the path segment S in a predetermined direction. Based on this metric, method 40 generates a total path metric for each candidate path $P_{C1} \ldots P_{CN}$. In one aspect, the total path metric for each candidate path $P_{C1} \ldots P_{CN}$ is computed by summing the path segment metric for each path segment S in the candidate path. Thus, the total path metric identifies the average amount of energy needed by the vehicle to traverse the entirety of the candidate path in the predetermined direction (box 48).

Once the candidate paths $P_{C1} \ldots P_{CN}$ have been generated and the total path metrics computed, method 40 selects one of the paths on the basis of the total path metrics (box 50). In particular, the selected path P is the path along which vehicle V will navigate to the destination location D, and is selected such that the amount of energy remaining in the vehicle V upon arriving at the destination location is greater than or equal to the predetermined amount of reserve energy previously identified by the operator. So selected, vehicle V navigates to the destination location D along the selected path. However, while vehicle V traverses the selected path P in the predetermined direction to the destination location D, computing device 10 measures the actual amount of energy used by the vehicle to traverse each path segment S of the selected path P (box 52), and updates the path segment metric of each path segment S in the selected path P based on this measured actual amount of energy (box 54).

Figure 5:
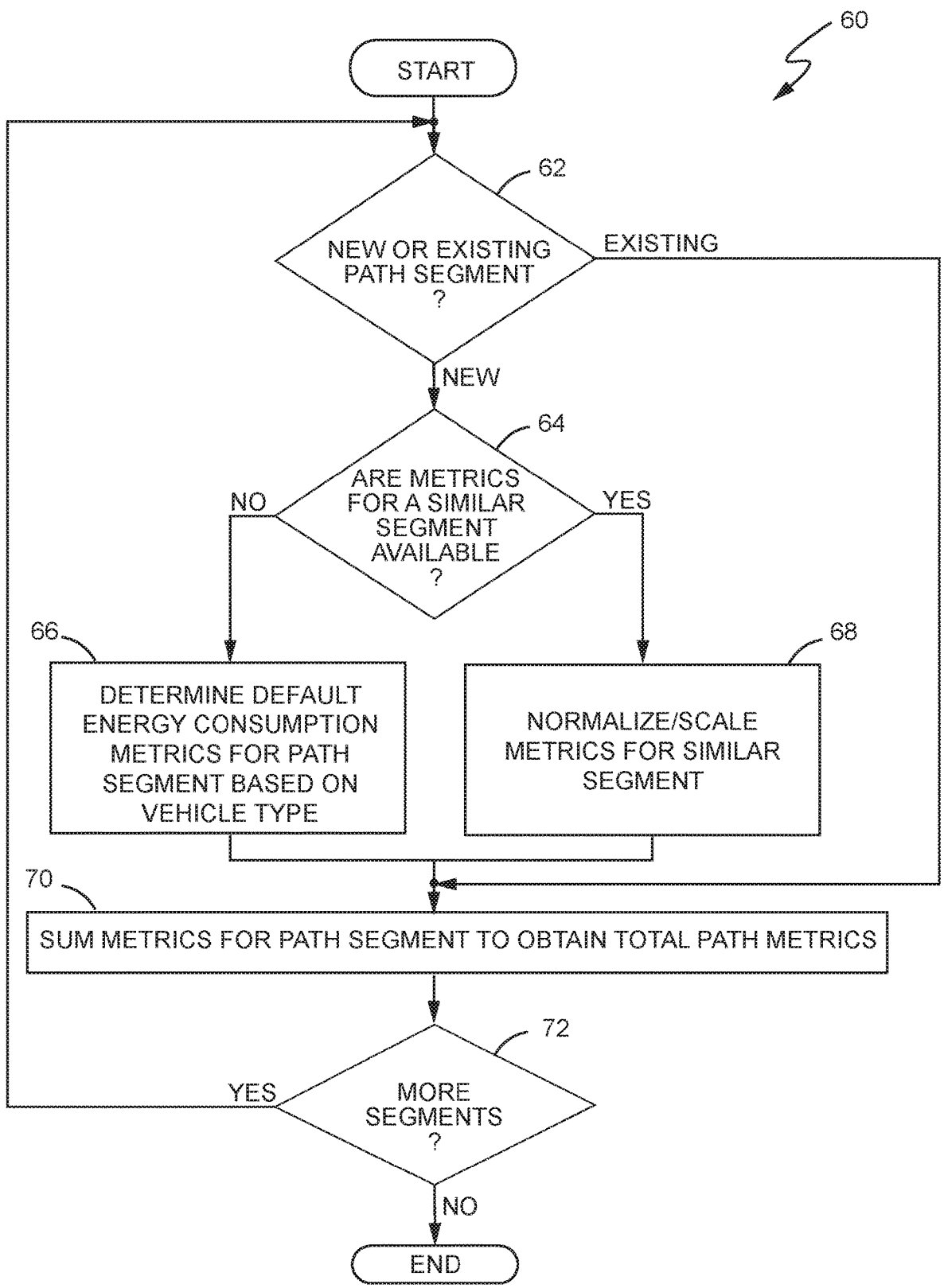
FIG. 5 is a flow diagram illustrating a method for generating one or more candidate paths according to one aspect of the present disclosure.

FIG. 5 is a flow diagram illustrating a more detailed method 60 for generating the one or more candidate paths $P_{C1} \ldots P_{CN}$ according to one aspect of the present disclosure. Particularly, as computing device 10 obtains the data and information for each path segment S, it determines whether the path segment S is a new path segment or an existing path segment (box 62). Existing path segments are those over which vehicle V, or a similar type of vehicle, is known to have previously traversed. Such path segments S will have a value in the VEHICLE TYPE field that is commensurate with the vehicle type of vehicle V. New path segments, however, are those that do not exist in the database at all, or are those in which the VEHICLE TYPE field does not have a value commensurate with the vehicle type of vehicle V.

Provided the path segment is an existing path segment (box 62), method 60 sums the AVERAGE ENERGY CONSUMED value of that path segment S to compute the total path metric, as previously described (box 70), and continues the process so long as more path segments are available for analysis (box 72).

If the path segment is a new path segment (box 62), however, the energy consumption database is searched for a similar path segment S. If no similar path segments S exist in the energy consumption database (box 64), method 60 will determine a default value for the AVERAGE ENERGY CONSUMED value. The default value can be any value needed or desired, but in one aspect of the present disclosure, the DEFAULT AVERAGE ENERGY CONSUMED value is based on various characteristics such as the type of vehicle V, the age of vehicle V, the type of tires vehicle V currently has, and the like (box 66). If a similar path segment S is available, however (box 64), method 60 will, if needed, normalize the AVERAGE ENERGY CONSUMED value of that similar path segment S and scale the metrics to generate suitable path segment metrics for the new path segment S (box 68). Regardless of whether a particular path segment S does or does not exist in the energy consumption database, however, method 60 sums the AVERAGE ENERGY CONSUMED value of that path segment S to compute the total path metric (box 70), as previously described, and continues the process until all the path segments S for the candidate path $P_{CN}$ have been analyzed and considered (box 72).

The functionality of method 60 allows aspects of the present disclosure to estimate the total path metric for a given candidate path $P_{CN}$ as accurately as possible even in situations where the candidate path $P_{CN}$ comprises one or more path segments S for which no data yet exists. This is beneficial in cases where the energy consumption database has been updated to identify one or more path segments associated with a newly constructed or temporary roadway, but not yet fully updated with energy consumption metrics for those new or temporary roadways.

Figure 6:
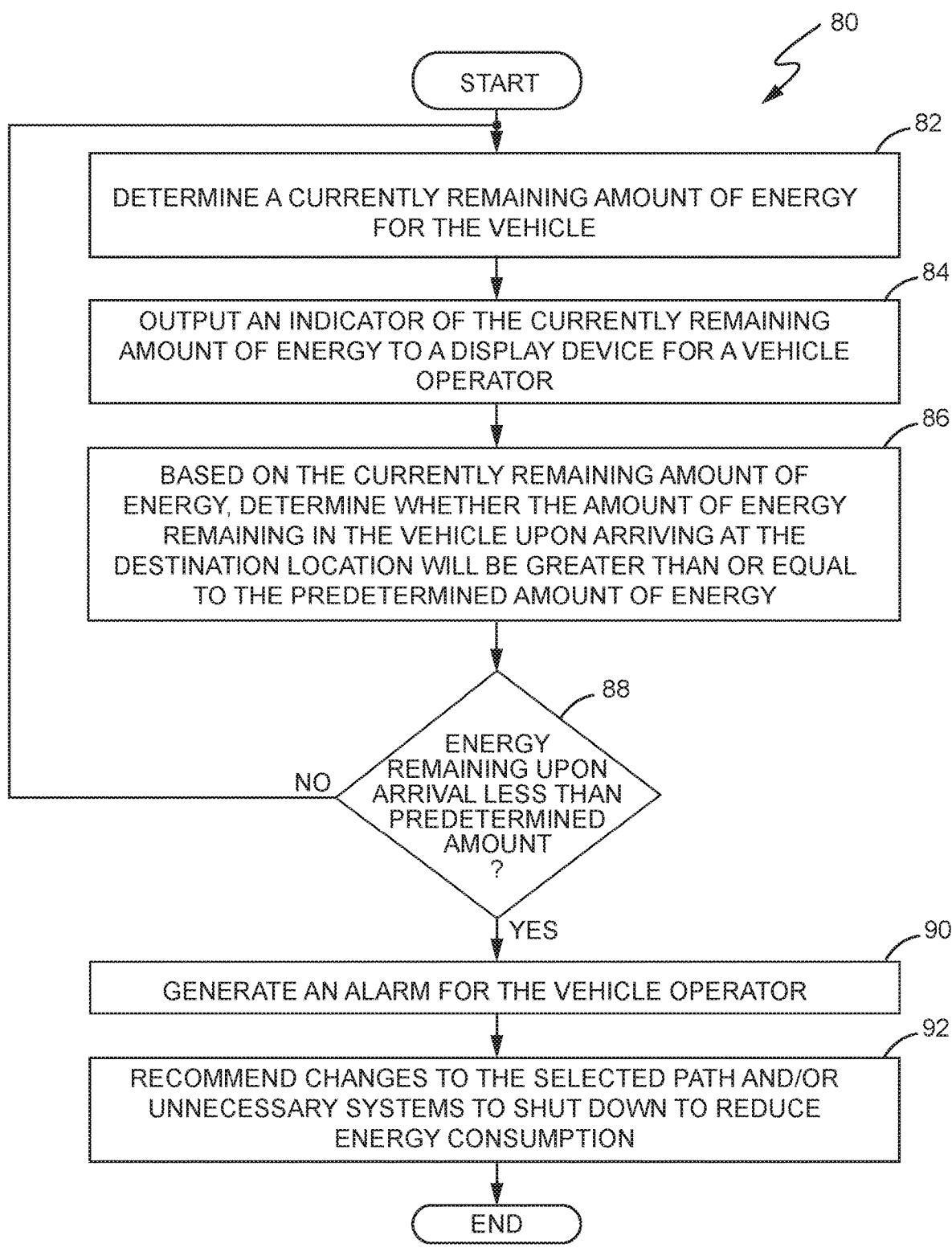
FIG. 6 is a flow diagram illustrating a method for managing the energy source of a vehicle during travel according to one aspect of the present disclosure.

FIG. 6 is a flow diagram illustrating a method 80 for updating the path segment metrics stored in the energy consumption database according to one aspect of the present disclosure. In this aspect, updates are based on data and information periodically gathered by vehicle V while it traverses selected path P to the destination location D. This helps to ensure that the metrics used to generate the candidate paths $P_{C1} \ldots P_{CN}$ are as accurate as possible, and thus, that the estimates of the amount of energy needed to traverse each path segment S, are as accurate as possible.

Method 80 begins with vehicle V determining how much energy it currently has remaining (box 82). For vehicles V that rely on fossil fuels for an energy source, such as gasoline or jet fuel, this can be accomplished using known sensors that measure the number of gallons of fuel remaining in a fuel tank. For electric vehicles V, this can be accomplished using sensors configured to measure a current capacity of the batteries in Watt-Hours (Wh). According to the present disclosure, this determination occurs periodically while the vehicle V traverses selected path P. In this aspect, however, vehicle V determines how much energy it has remaining whenever vehicle V crosses the ingress boundary $B_I$ for one or more of the path segments S.

Regardless of the type of energy that is measured, or the rate at which the remaining energy determination measurements occur, method 80 outputs an indication of measurement result to a display device or fuel gauge so that the operator of vehicle V can be informed of the amount of energy remaining (box 84). Then, based on the measured amount of energy, method 80 estimates whether vehicle V will still arrive at the destination location D having the predetermined amount of energy in reserve (box 86). This is because of the variety of factors that affect the energy consumption of vehicle V while traversing the selected path P. Particularly, traffic accidents, weather conditions, the velocity of vehicle V, wind speed and direction, wind drag, and the like, all have an impact on the energy consumption of vehicle V. Because these factors are dynamic and generally not known to computing device 10 prior to the start of traversal of path P, aspects of the present disclosure monitor the consumption of the energy resources of vehicle V during travel relative to these factors and adjust its estimates accordingly.

If method 80 determines that the amount of energy currently remaining in vehicle V indicates that it will arrive at destination location D with less than the desired amount of energy in reserve (box 88), an alarm, such as a visual and/or audible indication, is rendered to warn the operator that vehicle V is consuming more energy than expected (box 90). Additionally, in some aspects, method 80 will recommend that vehicle V follow an alternate path P to destination D and/or that one or more unnecessary systems be shut down or at least curtailed (box 92).

Particularly, in one aspect, computing device 10 generates one or more alternate paths between the current location of vehicle V and the destination location D based on the currently remaining amount of energy in vehicle V. Computing device 10 then outputs graphical representations of those paths to a display device in vehicle V and prompts the operator to select one of those new paths P. Once selected, vehicle V can then navigate to the destination location D along the newly-selected path P.

In another aspect, computing device 10 generates an alternate path and autonomously controls vehicle V to begin traversing the newly-generated alternate path to destination location D, or to a nearest filling or charging station. In other aspects, computing device 10 automatically controls some or all of the features of a vehicle V to reduce the energy consumption rate, or recommends to the vehicle operator that they be shut down or curtailed. Such control measures include, but are not limited to, the governing of an air conditioning unit, audio and/or visual components, such as the vehicle radio or display, the motor, and the like, and the reduction of speed. Regardless of the particular method or type and amount of control, however, such periodic monitoring of the vehicle's V energy source and new-path generation, if needed, helps reduce the rate of energy consumption by vehicle V when it is determined that vehicle V can no longer arrive at the destination D with the desired amount of energy in reserve.

Figure 7:
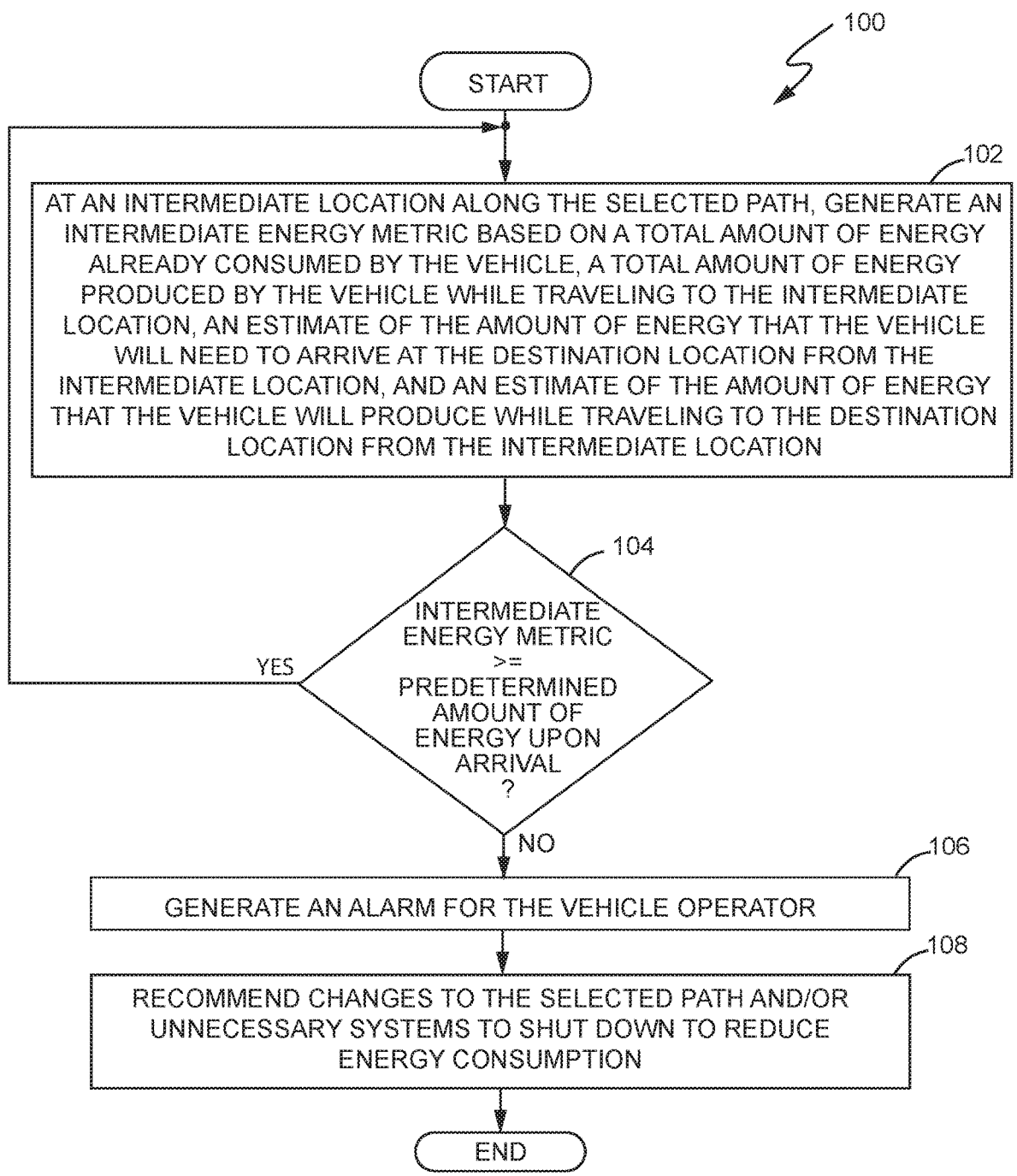
FIG. 7 is a flow diagram illustrating a more detailed method for managing the energy source of a vehicle during travel according to one aspect of the present disclosure.

FIG. 7 is a flow diagram illustrating a method 100 for determining whether vehicle V is likely to arrive at destination location D with the desired amount of energy in reserve according to one aspect of the present disclosure. As seen in FIG. 7, computing device 10 generates, at some intermediate location along selected path P, an intermediate energy metric based on one or more factors (box 102). Such factors include, but are not limited to:
- a total amount of energy already consumed by vehicle V;
- an estimate of the amount of energy that the vehicle still requires to arrive at the destination location D from the intermediate location;
- a total amount of energy produced by the vehicle while traveling to the intermediate location;
- an estimate of the amount of energy that the vehicle will produce while traveling to the destination location from the intermediate location;
- a wind drag coefficient based on sensor data received from a wind sensor associated with the vehicle.

The intermediate energy metric is then compared to the amount of reserve energy that vehicle V is required to contain upon arrival at destination location D (box 104). If the intermediate energy metric is greater than or equal to the predetermined amount of reserve energy for vehicle V, the process is again performed at some time in the future. If not, however, computing device 10 will generate an alert for the operator (box 106) and recommend a change to the selected path P, and/or that one or more unnecessary systems be shut down or curtailed, as previously described (box 108).

Figure 8:
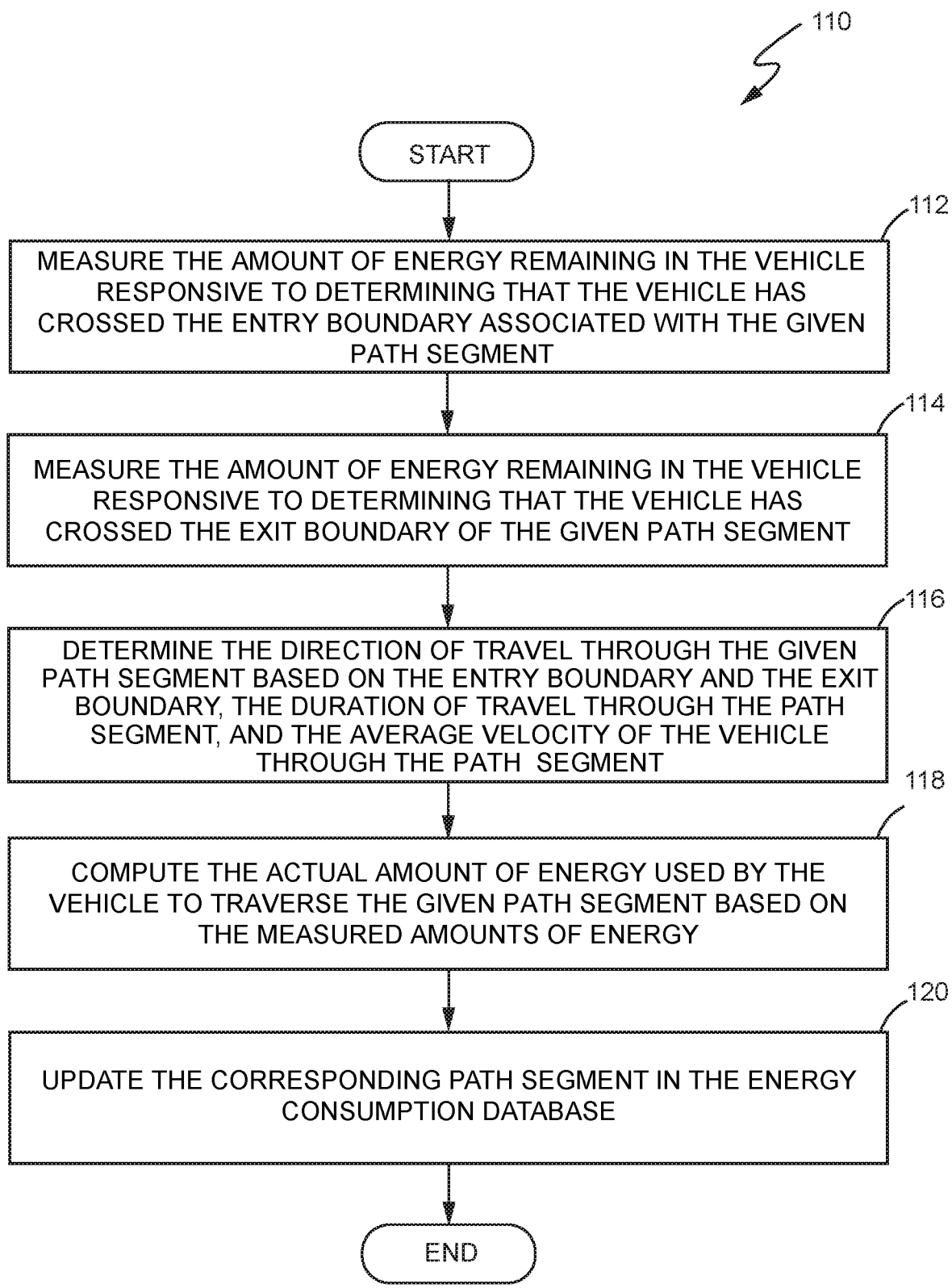
FIG. 8 is a flow diagram illustrating a method for updating the energy consumption database with information while the vehicle is traversing a selected path to the destination according to one aspect of the present disclosure.

FIG. 8 is a flow diagram illustrating a method 110 for updating the energy consumption database with information while vehicle V traverses selected path P according to one aspect of the present disclosure. Method 110 begins with vehicle V measuring the amount of energy that is remaining in vehicle V upon determining that vehicle V has crossed an ingress boundary $B_I$ associated with a given path segment S (box 112). Vehicle V then measures the amount of energy that is remaining in vehicle V upon determining that vehicle V has crossed an egress boundary $B_E$ associated with the given path segment S (box 114). The direction of travel through the given path segment S is then determined, as is the duration of travel and average velocity of vehicle V through the given path segment S (box 116). Computing device 10 then computes the actual amount of energy that vehicle V used to traverse the given path segment S based on these values, and updates the information corresponding to the given path segment S in the energy consumption database (box 120).

Figure 9:
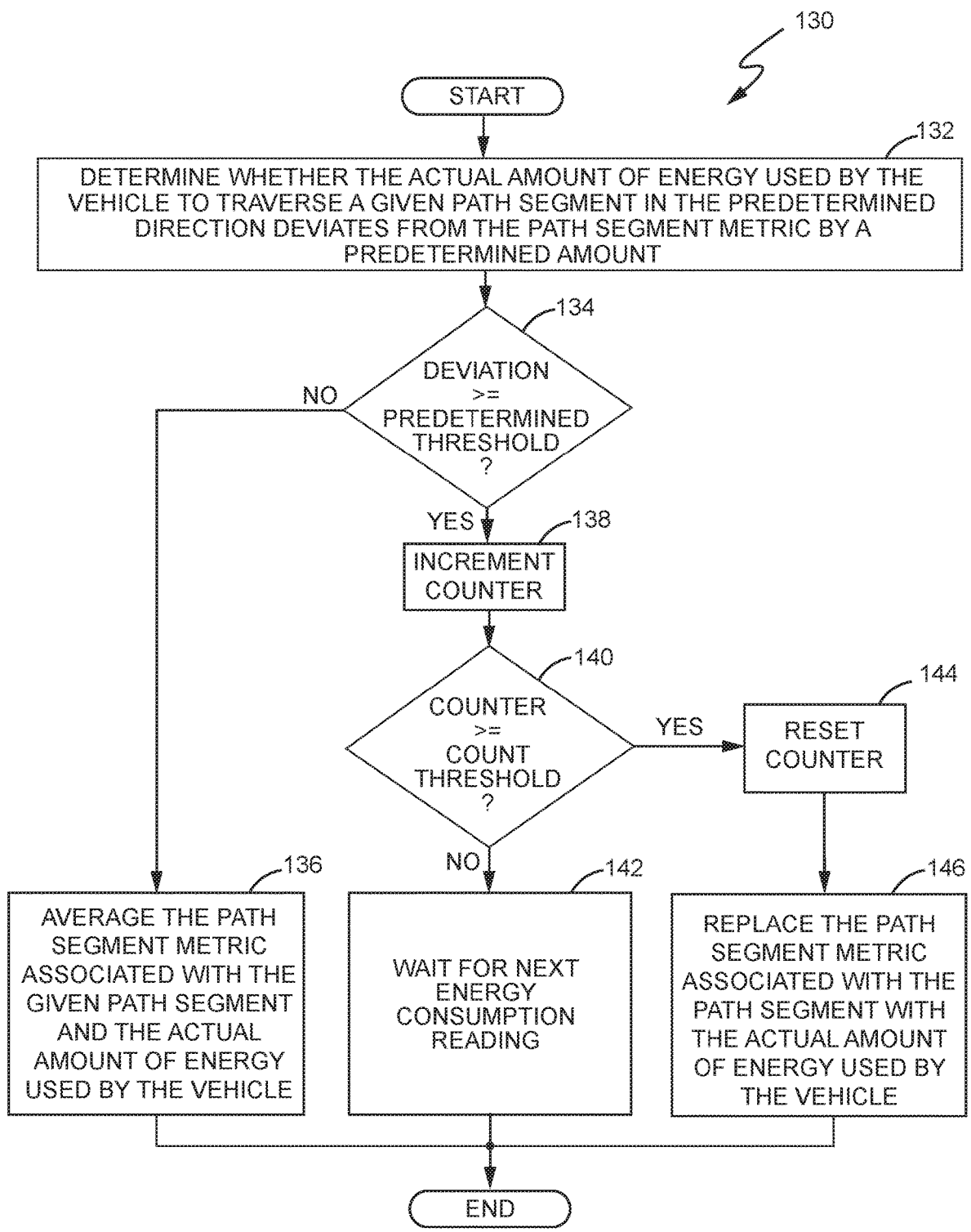
FIG. 9 is a flow diagram illustrating a method for processing the information that is used to update the energy consumption database according to one aspect of the present disclosure.

FIG. 9 is a flow diagram illustrating a method 130 for processing the information that is used to update the energy consumption database according to one aspect of the present disclosure. Such information includes, but is not limited to, the path segment metrics that are utilized in aspects of the present disclosure to generate the candidate paths $P_{C1} \ldots P_{CN}$. In the aspect of FIG. 9, the AVERAGE ENERGY CONSUMED metric for a given path segment S is updated based on the actual amount of energy consumed by a vehicle V traversing the path segment S.

Method 130 begins with computing device 10 determining whether the actual amount of energy used by the vehicle to traverse a given path segment S in a predetermined direction deviates from the AVERAGE ENERGY CONSUMED metric already associated with the given path segment S in the energy consumption database by a predetermined amount (box 132). In one aspect, this determination is made by dividing the actual amount of energy used by the vehicle to traverse the given path segment S by the AVERAGE ENERGY CONSUMED metric already associated with the given path segment S, and then comparing the resultant value to a predetermined threshold value (box 134). If the deviation is not greater than or equal to the predetermined threshold value, computing device 10 averages the path segment metric associated with the given path segment S and the actual amount of energy used by the vehicle, and updates the AVERAGE ENERGY CONSUMED metric for the given segment S in the energy consumption database with the averaged value (box 136).

Method 130 maintains the AVERAGE ENERGY CONSUMED metric of path segment S at an accurate average value. It is possible, however, to unintentionally "corrupt" this average value given an extreme event along path segment S. In particular, the actual energy usage for vehicles V traversing a path segment S generally remains relatively close to the average value (i.e., the deviation is less than the predetermined threshold) given average traffic conditions. However, there are situations in which the actual energy consumption values reported by vehicles V are abnormally high. The reasons for such situations vary, but abnormally high actual energy consumption values could reflect an event that will affect the energy consumption of all vehicles V traversing path segment S, such as a traffic slowdown on path segment S due to an accident, the existence of a checkpoint, debris on the road, and the like. On the other hand, abnormally high energy consumption values may be indicative of an event that affects only that vehicle V, such as when the operator stops vehicle V on the side of the road to perform some action, pulls into a rest stop, and the like.

Regardless of the particular type of event, the actual energy consumption values that get reported are "outlier" values that can, potentially, suddenly increase the value of the AVERAGE ENERGY CONSUMED metric. Eventually, the value of this metric would return to its more accurate average value, but until then, the AVERAGE ENERGY CONSUMED metric might not be as accurate as it should be. Therefore, to prevent such outlier values from suddenly increasing the value of the "true" AVERAGE ENERGY CONSUMED metric, one aspect of the present disclosure monitors the rate at which such "outlier" values are reported. According to the disclosure, outlier values are considered invalid for use in updating the database unless enough vehicles V report "outlier" actual energy consumption values within a predefined time period.

Returning to FIG. 9, then, if the deviation is greater than or equal to the predetermined threshold value, indicating that an outlier value has been reported (box 134), aspects of the present disclosure will increment an "outlier" counter (box 138) and compare the incremented value to another count threshold value (box 140). If the comparison indicates that the counter is less than the count threshold, method 130 considers the reported outlier value to possibly be invalid for use in updating the energy consumption database. In these cases, method 130 foregoes updating the database, and instead, waits for the next reported actual energy consumption value for path segment S (box 142). However, if the counter is greater than or equal to the count threshold (box 140), aspects of the present disclosure consider the outlier value to be valid, reset the outlier counter (box 144), and replace the AVERAGE ENERGY CONSUMED metric value associated with the given path segment S in the energy consumption database with the value that indicates the actual amount of energy used by the vehicle to traverse the given path segment S (box 146).

It should be noted that method 130 illustrates a situation in which the AVERAGE ENERGY CONSUMED metric value is prevented from being increased prematurely. However, those of ordinary skill in the art should realize that aspects of the present disclosure also use a similar method to guard against premature decreases in the AVERAGE ENERGY CONSUMED metric value, albeit using different predetermined threshold comparisons.

Additionally, in one aspect, the "outlier" counter is time-qualified. That is, aspects of the present disclosure maintain a timer to track whether the outlier counter changes within a predefined time period, such as 1 minute. If the outlier counter is not incremented or decremented within that time period, method 130 resets the outlier counter to 0. This helps to ensure that the outlier energy consumption values are being reported in response to an event, such as a traffic accident, that will actually affect the energy consumption of the vehicles traversing path segment S, and not by a vehicle V that may have temporarily stopped on the side of the road.

Further, while the present disclosure is not limited to such, method 130 is illustrated as being advantageously implemented by a network-based computer server device. One reason for this is that a network computer server processes and averages the actual energy consumed values received from many vehicles V, and as such, is able to estimate the AVERAGE ENERGY CONSUMED metric value more accurately.

Moreover, a vehicle V configured to implement method 130 is likely to traverse a path in which the deviation is greater than or equal to the predetermined threshold (box 134) only once or twice. Accordingly, a vehicle V will generate an outlier value only once or twice for a given path segment S, and any time-qualified counter values resulting from these situations are likely to "time-out" before the count threshold (box 140) is ever reached. When this type of situation occurs, method 130 will ignore any outlier values for the path segment S, meaning that the estimate for the AVERAGE ENERGY CONSUMED metric value would be too low. However, a network-based computer server supporting this function for many different vehicles V would receive many outlier values from different vehicles V with a given time period. Thus, the counter value/count threshold comparison, when implemented at a network server, would trigger the replacement of the AVERAGE ENERGY CONSUMED metric value faster than it would if method 130 were implemented at the vehicle V. In some cases, a vehicle-based implementation of method 130 might not trigger the replacement of the AVERAGE ENERGY CONSUMED metric value at all.

Of course, those of ordinary skill in the art will readily appreciate that it is possible to implement method 130 of FIG. 9 in a vehicle V in addition to, or in lieu of, implementation at a network-based computer server. In such vehicle-based implementations, the count threshold value (box 140) can be reduced to an adequate lower value to ensure that the replacement step (box 146) occurs when needed. Alternatively, incrementing the counter value (box 134), comparing the counter to a threshold (box 140), and resetting the counter value to 0 (box 144) can be omitted.

It should be noted that in some aspects of the present disclosure, computing device 10 might also have access to traffic flow maps, which provide real-time estimates of the traffic flow for a given area. In such aspects, computing device 10 can be configured to beneficially utilize this information. Particularly, according to the present disclosure, vehicle V is configured to utilize the information in these maps when determining the candidate paths, the alternate paths, and/or whether the vehicle V will be able to arrive at the destination location D having the predetermined amount of energy in reserve.

Figure 10A:
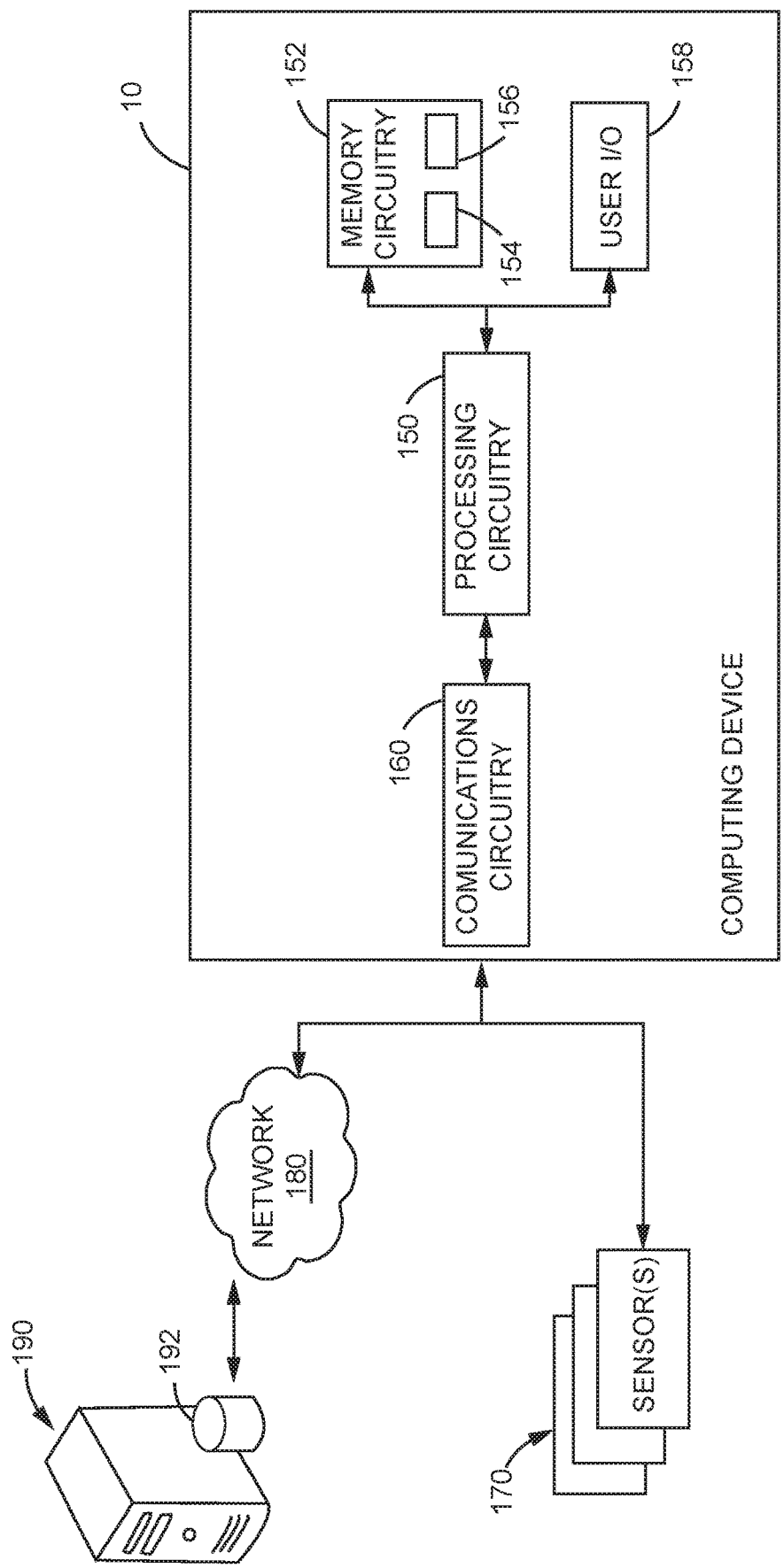
FIGS. 10A-10B are functional block diagrams illustrating respective implementation architectures of the aspects of the present disclosure.
Figure 10B:
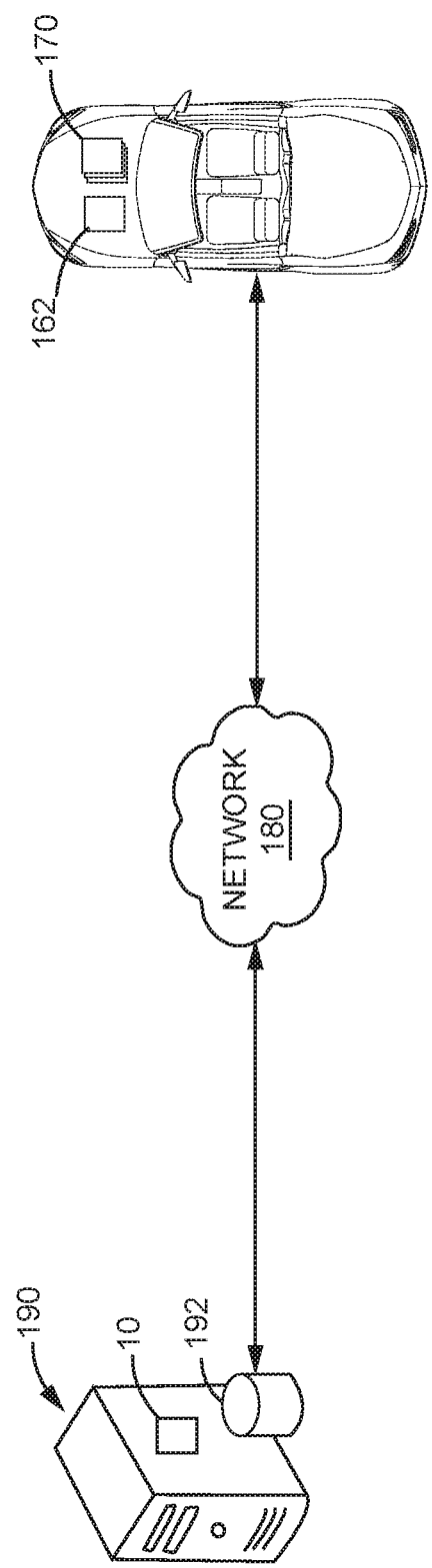

FIGS. 10A-10B are functional block diagrams illustrating respective implementation architectures of the aspects of the present disclosure. FIG. 10A illustrates an aspect of the disclosure in which computing device 10 is implemented in vehicle V. As seen in FIG. 10A, the computing device 10 comprises processing circuitry 150, memory circuitry 152, a user input/output (I/O) interface 158, and communications circuitry 160.

Processing circuitry 150 is communicatively coupled via one or more buses to memory circuitry 152, user I/O 158, and communications circuitry 160. Additionally, processing circuitry 150 is communicatively connected to one or more sensors 170 associated with vehicle V. Such sensors include, but are not limited to, fuel sensors, battery sensors, global positioning satellite (GPS) circuitry, rain sensors, wind sensors, and the like. In operation, the sensors 170 provide processing circuitry 150 with signals and data that is used to measure the amount of energy remaining, the weather conditions, determine current positioning, and the like.

According to various aspects of the present disclosure, processing circuitry 150 comprises one or more microprocessors, microcontrollers, hardware circuits, discrete logic circuits, hardware registers, digital signal processors (DSPs), field-programmable gate arrays (FPGAs), application-specific integrated circuits (ASICs), or a combination thereof. In one such aspect, the processing circuitry 150 includes programmable hardware capable of executing software instructions stored, e.g., as a machine-readable computer control program 154 in memory circuitry 152.

More particularly, processing circuitry 150 is configured to execute the control program 154 to manage an energy source of vehicle V according to aspects of the present disclosure, as previously described. Such management includes, but is not limited to, the initialization of the energy consumption services, the determination of the origination and destination locations, the determination of a reserve amount of energy upon arrival at the destination location, the generation of the one or more candidate paths $P_{C1} \ldots P_{CN}$ based on the path segment metrics of the path segments S stored in the energy consumption database, the selection of a desired path P to the destination location D, the monitoring of the energy consumption by vehicle V during travel to the destination location D, and the updating of the path segment metrics stored in the energy consumption database based on the monitoring. Processing circuitry 150 is configured to implement this functionality in accordance with the data and information stored in the energy consumption database, which can be stored in the memory circuit 152 as energy consumption database 156, in a network as energy consumption database 192, or both.

The user I/O 158 comprises circuitry configured to allow a user to interface with computing device 10. Particularly, via the user I/O 158, the operator of vehicle V can identify a destination location D, select a path P to the destination location D, receive audible and/or visible alerts from computing device 10 regarding the energy consumption of vehicle V, and the like. The user I/O can comprise a variety of different devices and/or circuitry. However, in one aspect, user I/O 158 includes, but is not limited to, display devices such as a Liquid Crystal Display (LCD) and/or a Light Emitting Diode (LED) display for presenting visual information to a user, one or more graphics adapters, display ports, video buses, a touchscreen, a graphical processing unit (GPU), and audio output devices such as speakers, as well as circuitry and devices for accepting input from a user. Such input circuitry and devices include a pointing device (e.g., a mouse, stylus, touchpad, trackball, pointing stick, joystick), a microphone (e.g., for speech input), an optical sensor (e.g., for optical recognition of gestures), and/or a keyboard (e.g., for text entry).

According to particular aspects of the present disclosure, user I/O 158 is implemented as a unitary physical component, or as a plurality of physical components that are contiguously or separately arranged, any of which may be communicatively coupled to any other, or communicate with any other component via processing circuitry 150.

Communications circuitry 160 is configured to facilitate the communication of data and information between the computing device 10, the one or more sensors 170, and the network server 190 via communications network 180. In some aspects of the present disclosure, communications circuitry 160 includes a transceiver configured to send and receive communication signals to and from the network server 190 via communications network 180 to retrieve information from, and send information to, energy consumption database 192.

As previously stated, the computing device 10 need not be implemented in vehicle V. In some aspects of the present disclosure, seen in FIG. 10B, computing device 10 is implemented by the network server 190. In these aspects, vehicle V could include an on-board computer 162 that communicates with computing device 10 via network 180. Particularly, the on-board computer 162 would be configured to receive data from the one or more sensors 170, provide that data to computing device 10, and receive information and data from computing device 10, such as the previously described one or more candidate paths, alerts, and the like.

Figure 11:
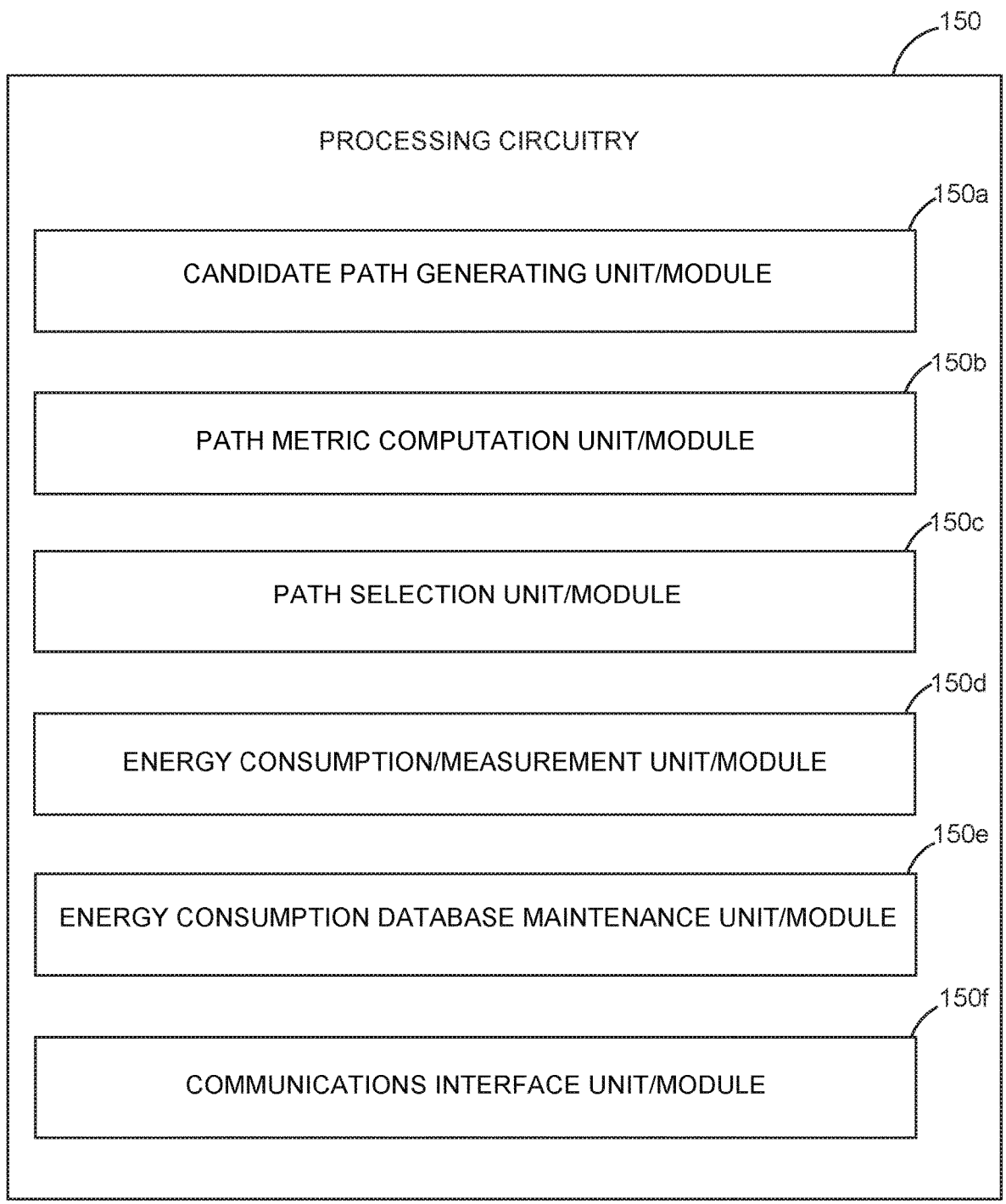
FIG. 11 is a functional block diagram illustrating processing circuitry configured to implement aspects of the present disclosure.

FIG. 11 is a functional block diagram illustrating processing circuitry 150 implemented according to different hardware units and software modules (e.g., as control program 154 stored on memory circuitry 152 according to one aspect of the present disclosure. As seen in FIG. 11, processing circuitry 150 implements a candidate path generating unit and/or module 150a, a path metric computation unit and/or module 150b, a path selection unit and/or module 150c, an energy consumption/measurement unit and/or module 150d, an energy consumption database maintenance unit and/or module 150e, and a communications interface unit and/or module 150f.

The candidate path generating unit and/or module 150a is configured to generate one or more candidate paths $P_{C1} \ldots P_{CN}$, based on the path segment metric data and information stored in the energy consumption database, such that the vehicle V can arrive at the destination location with a predetermined amount of energy in reserve. The path metric computation unit and/or module 150b is configured to calculate the total path metric for each of the candidate paths based on the path segment metrics in the energy consumption database. The path selection unit and/or module 150c is configured to select a path P from the one or more candidate paths $P_{C1} \ldots P_{CN}$. In one aspect, the path P is selected by an operator of vehicle V. In another aspect, however, device 10 selects the path P for vehicle V autonomously. The energy consumption/measurement unit and/or module 150d is configured to measure the consumption of the energy by vehicle V while traveling to the destination location D along the selected path P. The energy consumption database maintenance unit and/or module 150e is configured to update the energy consumption database with the data and information obtained by the energy consumption/measurement unit and/or module 150d. The communications interface unit and/or module 150f is configured to communicate the data and information with the energy consumption database, as well as with the one or more sensors 170.

Aspects of the present disclosure further include various methods and processes, as described herein, implemented using various hardware configurations configured in ways that vary in certain details from the broad descriptions given above. For instance, one or more of the processing functionalities discussed above may be implemented using dedicated hardware, rather than a microprocessor configured with program instructions, depending on, e.g., the design and cost tradeoffs for the various approaches, and/or system-level requirements.

Figure 12:
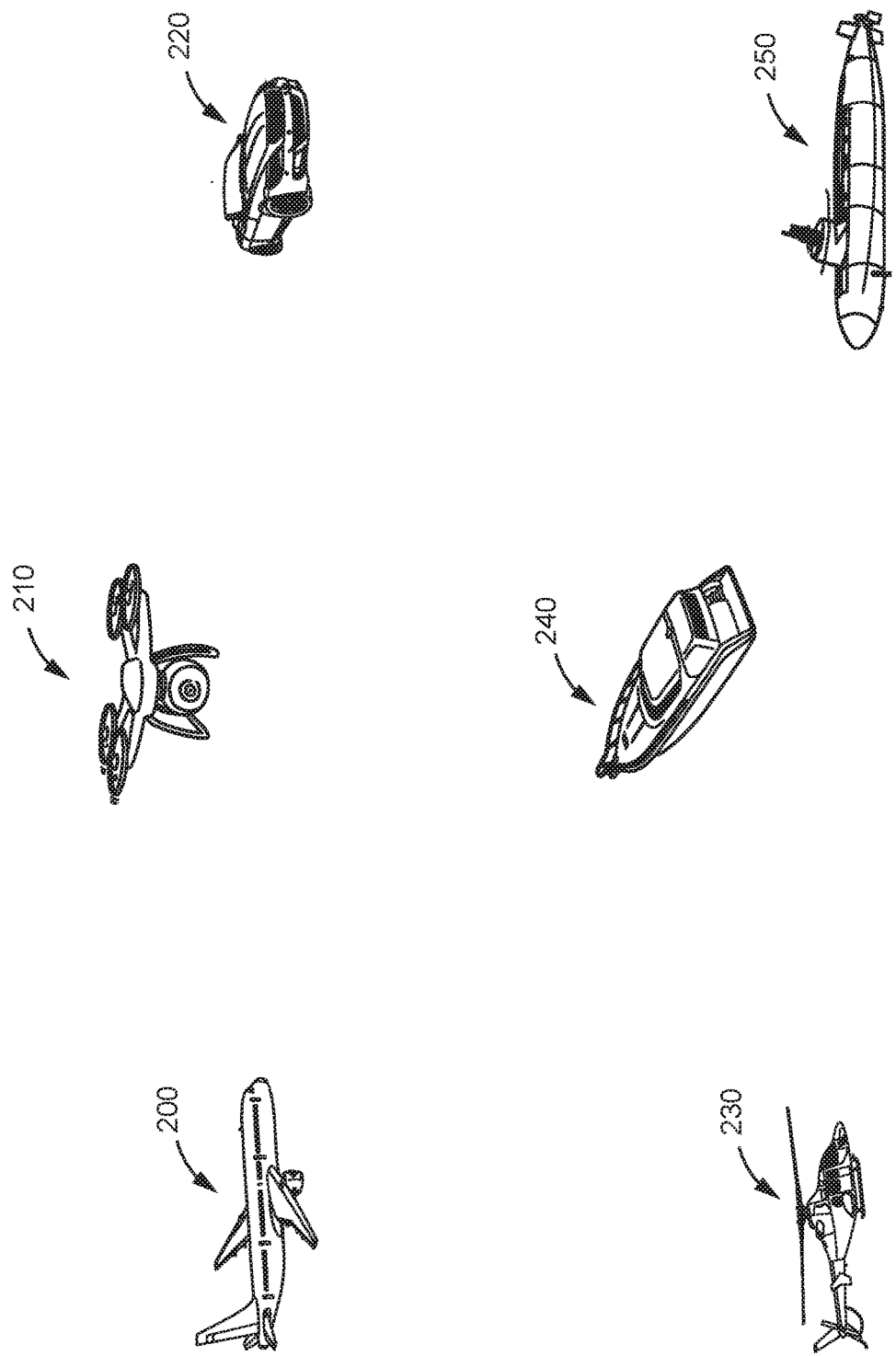
FIG. 12 illustrates various types of vehicles that may be configured to implement aspects of the present disclosure.

It should be noted that the previous aspects describe the present disclosure in the context of an electric vehicle. However, this is for illustrative purposes only. Those of ordinary skill in the art will readily appreciate that aspects of the present disclosure are also well-suited for managing the energy resources of other types of vehicles. FIG. 12 illustrates such vehicles as being a fixed wing aircraft 200, unmanned and/or remotely controlled aircraft 210, automobiles that utilize fossil fuels 220, rotorcraft 230 such as helicopters, surface craft 240 such as boats, and submersible craft 250 such as submarines.

Additionally, aspects of the present disclosure are described with computing device 10 being implemented in a vehicle V. In such aspects, computing device 10 can be configured to download some or all of the information in the energy consumption database via network 180, either upon initialization or on an as-needed basis. In other aspects, vehicle V is configured to obtain the energy consumption information from other computing devices 10 associated with other vehicles V via a peer-to-peer network. This latter aspect is especially beneficial for vehicles V that are unable to communicate with a network-based server implantation of the present disclosure, or wish to augment the information in the energy consumption database with the data of the other vehicles V.

The foregoing description and the accompanying drawings represent non-limiting examples of the methods and apparatus taught herein. As such, the aspects of the present disclosure are not limited by the foregoing description and accompanying drawings. Instead, the aspects of the present disclosure are limited only by the following claims and their legal equivalents.

What is claimed is:

1. A method for managing an energy source of a vehicle, the method comprising:
   generating one or more candidate paths between an origination location and a destination location based on one or more path segments stored in an energy consumption database, wherein each path segment has an associated path segment metric that identifies an average amount of energy needed by a vehicle to traverse the path segment in a predetermined direction;
   for each of the one or more candidate paths, generating a total path metric based on the path segment metrics associated with each path segment of the candidate path, wherein the total path metric identifies the average amount of energy needed by the vehicle to traverse the candidate path in the predetermined direction;
   selecting a path from the one or more candidate paths based on the total path metrics, wherein the path is selected such that the amount of energy remaining in the vehicle upon arriving at the destination location is greater than or equal to a predetermined amount of energy; and
   while the vehicle traverses the selected path;
      measuring the actual amount of energy used by the vehicle to traverse a given path segment in the predetermined direction;
      updating the path segment metric associated with the given path segment in the energy consumption database based on the actual amount of energy used by the vehicle to traverse the given path segment in the predetermined direction;
      estimating an amount of energy that the vehicle will produce while traveling to the destination location; and
      determining whether an amount of energy remaining in the vehicle upon arriving at the destination location will be greater than or equal to a predetermined amount of energy based, in part, on the estimated amount of energy that the vehicle will produce while traveling to the destination location.

2. The method of claim 1 wherein while the vehicle traverses the selected path, the method further comprises:
   periodically determining a currently remaining amount of energy for the vehicle;
   outputting an indicator of the currently remaining amount of energy to a display device for a vehicle operator;
   determining whether the amount of energy remaining in the vehicle upon arriving at the destination location will be greater than or equal to the predetermined amount of energy based additionally on the currently remaining amount of energy; and
   generating an alarm for the vehicle operator responsive to determining that the amount of energy remaining in the vehicle upon arriving at the destination location will be less than the predetermined amount of energy.

3. The method of claim 2 wherein determining whether the amount of energy remaining in the vehicle upon arriving at the destination location will be greater than or equal to the predetermined amount of energy comprises:
   generating, at an intermediate location along the selected path, an intermediate energy metric based on a total amount of energy already consumed by the vehicle and an estimate of the amount of energy that the vehicle will need to arrive at the destination location from the intermediate location;
   comparing the intermediate energy metric to the predetermined amount of energy; and determining whether the amount of energy remaining in the vehicle upon arriving at the destination location will be greater than or equal to the predetermined amount of energy based additionally on a result of the comparison.

4. The method of claim 3 wherein generating the intermediate energy metric further comprises generating the intermediate energy metric based on a total amount of energy produced by the vehicle while traveling to the intermediate location and the estimated amount of energy that the vehicle will produce while traveling to the destination location from the intermediate location.

5. The method of claim 1 wherein the path segment metric for each path segment in the energy consumption database further identifies an ingress boundary for the path segment, an egress boundary for the path segment, and a direction of travel for the path segment.

6. The method of claim 5 wherein measuring the actual amount of energy used by the vehicle to traverse a given path segment in the predetermined direction comprises:
   measuring the amount of energy remaining in the vehicle responsive to determining that the vehicle has crossed the ingress boundary associated with the given path segment;
   measuring the amount of energy remaining in the vehicle responsive to determining that the vehicle has crossed the egress boundary of the given path segment; and
   computing the actual amount of energy used by the vehicle to traverse the given path segment based on the measured amounts of energy.

7. The method of claim 5 wherein the path segment metric for each path segment in the energy consumption database further identifies a distance between the ingress boundary and the egress boundary, a duration of travel through the given path segment, and an average velocity of the vehicle traveling through the given path segment, and wherein the method further comprises:
   determining:
      the direction of travel through the given path segment based on the ingress boundary and the egress boundary;
      the duration of travel through the given path segment; and
      the average velocity of the vehicle based on the duration of travel and the distance between the ingress boundary and the egress boundary; and
   updating the path segment metric associated with the given path segment in the energy consumption database based on the determined direction of travel, the determined duration of travel, and the determined average velocity of the vehicle.

8. The method of claim 1 further comprising navigating the vehicle to the destination location via the selected path.

9. The method of claim 1 wherein updating the path segment metric associated with the given path segment in the energy consumption database comprises:
   determining whether the actual amount of energy used by the vehicle to traverse a given path segment in the predetermined direction deviates from the path segment metric by a predetermined amount;
   averaging the path segment metric associated with the given path segment and the actual amount of energy used by the vehicle responsive to determining that the actual amount of energy used by the vehicle does not deviate from the path segment metric for the path segment by a predetermined threshold; and
   replacing the path segment metric associated with the path segment with the actual amount of energy used by the vehicle responsive to determining that the actual amount of energy needed by the vehicle does deviate from the path segment metric by a predetermined threshold.

10. A computing device configured to manage an energy source for a vehicle, the computing device comprising:
    a communications interface configured to communicate data with one or more devices; and
    processing circuitry configured to:
       generate one or more candidate paths between an origination location and a destination location based on one or more path segments stored in an energy consumption database, wherein each path segment has an associated path segment metric that identifies an average amount of energy needed by a vehicle to traverse the path segment in a predetermined direction;
       for each of the one or more candidate paths, generate a total path metric based on the path segment metrics associated with each path segment of the candidate path, wherein the total path metric identifies the average amount of energy needed by the vehicle to traverse the candidate path in the predetermined direction;
       select a path from the one or more candidate paths based on the total path metrics, wherein the path is selected such that the amount of energy remaining in the vehicle upon arriving at the destination location is greater than or equal to a predetermined amount of energy; and
       while the vehicle traverses the selected path:
          measure the actual amount of energy used by the vehicle to traverse a given path segment in the predetermined direction;
          update the path segment metric associated with the given path segment in the energy consumption database based on the actual amount of energy used by the vehicle to traverse the given path segment in the predetermined direction;
          estimate an amount of energy that the vehicle will produce while traveling to the destination location; and
          determine whether an amount of energy remaining in the vehicle upon arriving at the destination location will be greater than or equal to a predetermined amount of energy based, in part, on the estimated amount of energy that the vehicle will produce while traveling to the destination location.

11. The computing device of claim 10 wherein while the vehicle traverses the selected path, the processing circuit is further configured to:
    receive periodic signals from an energy sensor reporting a currently remaining amount of energy for the vehicle;
    output an indicator of the currently remaining amount of energy to a display device associated with the vehicle;
    determine whether the amount of energy remaining in the vehicle upon arriving at the destination location will be greater than or equal to the predetermined amount of energy based additionally on the currently remaining amount of enemy; and
    generate an alarm responsive to determining that the amount of energy remaining in the vehicle upon arriving at the destination location will be less than the predetermined amount of energy.

12. The computing device of claim 11 wherein to determine whether the amount of energy remaining in the vehicle upon arriving at the destination location will be greater than or equal to the predetermined amount of energy, the processing circuitry is further configured to:
  generate, at an intermediate location along the selected path, an intermediate energy metric based on a total amount of energy already consumed by the vehicle and an estimate of the amount of energy that the vehicle will need to arrive at the destination location from the intermediate location;
  compare the intermediate energy metric to the predetermined amount of energy; and
  determine whether the amount of energy remaining in the vehicle upon arriving at the destination location will be greater than or equal to the predetermined amount of energy based additionally on a result of the comparison.

13. The computing device of claim 12 wherein to generate the intermediate energy metric, the processing circuitry is further configured to generate the intermediate energy metric based on a total amount of energy produced by the vehicle while traveling to the intermediate location and the estimated amount of energy that the vehicle will produce while traveling to the destination location from the intermediate location.

14. The computing device of claim 10 wherein the path segment metric for each path segment in the energy consumption database further identifies an ingress boundary for the path segment, an egress boundary for the path segment, and a direction of travel for the path segment.

15. The computing device of claim 14 wherein to measure the actual amount of energy used by the vehicle to traverse a given path segment in the predetermined direction, the processing circuitry is further configured to:
  measure the amount of energy remaining in the vehicle responsive to determining that the vehicle has crossed the ingress boundary associated with the given path segment;
  measure the amount of energy remaining in the vehicle responsive to determining that the vehicle has crossed the egress boundary of the given path segment; and
  calculate the actual amount of energy used by the vehicle to traverse the given path segment based on the measured amounts of energy.

16. The computing device of claim 14 wherein the path segment metric for each path segment in the energy consumption database further identifies a distance between the ingress boundary and the egress boundary, a duration of travel through the given path segment, and an average velocity of the vehicle traveling through the given path segment, and wherein the processing circuitry is further configured to:
  determine:
    the direction of travel through the given path segment based on the ingress boundary and the egress boundary;
    the duration of travel through the given path segment; and
    the average velocity of the vehicle through the given path segment based on the duration of travel and the distance between the ingress boundary and the egress boundary; and
  updating the path segment metric associated with the given path segment in the energy consumption database based on the determined direction of travel, the determined duration of travel, and the determined average velocity of the vehicle.

17. The computing device of claim 10 wherein to update the path segment metric associated with the given path segment in the energy consumption database, the processing circuitry is further configured to:
  determine whether the actual amount of energy used by the vehicle to traverse a given path segment in the predetermined direction deviates from the path segment metric by a predetermined amount;
  average the path segment metric associated with the given path segment and the actual amount of energy used by the vehicle responsive to determining that the actual amount of energy used by the vehicle does not deviate from the path segment metric for the path segment by a predetermined threshold; and
  replace the path segment metric associated with the path segment with the actual amount of energy used by the vehicle responsive to determining that the actual amount of energy needed by the vehicle does deviate from the path segment metric by a predetermined threshold.

18. The computing device of claim 17 wherein the processing circuitry is further configured to:
  determine whether a value representing the actual amount of energy used by the vehicle is an outlier value based on a comparison with a time-qualified count threshold; and
  replace the path segment metric associated with the path segment with the value representing the actual amount of energy used by the vehicle based on the comparison.

19. The computing device of claim 10 wherein the processing circuitry is further configured to:
  calculate a wind drag coefficient based on sensor data received from a wind sensor associated with the vehicle;
  determine a velocity and direction of travel for the vehicle; and
  generate the total path metric based additionally on the wind drag coefficient, the velocity of the vehicle, and the direction of travel for the vehicle.

20. A non-transitory computer readable medium storing a computer program product for controlling a programmable computing device of a vehicle, the computer program product comprising software instructions that, when executed on processing circuitry of the programmable computing device, cause the processing circuitry to:
  generate one or more candidate paths between an origination location and a destination location based on one or more path segments stored in an energy consumption database, wherein each path segment has an associated path segment metric that identifies an average amount of energy needed by a vehicle to traverse the path segment in a predetermined direction;
  for each of the one or more candidate paths, generate a total path metric based on the path segment metrics associated with each path segment of the candidate path, wherein the total path metric identifies the average amount of energy needed by the vehicle to traverse the candidate path in the predetermined direction;
  select a path from the one or more candidate paths based on the total path metrics, wherein the path is selected such that the amount of energy remaining in the vehicle upon arriving at the destination location is greater than or equal to a predetermined amount of energy; and
  while the vehicle traverses the selected path:
    measure the actual amount of energy used by the vehicle to traverse a given path segment in the predetermined direction;
    update the path segment metric associated with the given path segment in the energy consumption database based on the actual amount of energy used by the vehicle to traverse the given path segment in the predetermined direction;

estimate an amount of energy that the vehicle will produce while traveling to the destination location; and determine whether an amount of energy remaining in the vehicle upon arriving at the destination location will be greater than or equal to a predetermined amount of energy based, in part, on the estimated amount of energy that the vehicle will produce while traveling to the destination location.

\* \* \* \* \*